(12) United States Patent
Hayashi

(10) Patent No.: US 9,640,525 B2
(45) Date of Patent: May 2, 2017

(54) ESD PROTECTION CIRCUIT, SEMICONDUCTOR DEVICE, ON-VEHICLE ELECTRONIC DEVICE, AND ON-VEHICLE ELECTRONIC SYSTEM

(71) Applicant: Renesas Electronics Corporation, Kawasaki-shi (JP)

(72) Inventor: Yutaka Hayashi, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 239 days.

(21) Appl. No.: 14/290,651

(22) Filed: May 29, 2014

(65) Prior Publication Data

US 2015/0002965 A1  Jan. 1, 2015

(30) Foreign Application Priority Data

Jun. 28, 2013 (JP) ................................. 2013-136087
Mar. 27, 2014 (JP) ................................. 2014-065602

(51) Int. Cl.
*H02H 9/00* (2006.01)
*H01L 27/02* (2006.01)

(52) U.S. Cl.
CPC ................................ *H01L 27/0266* (2013.01)

(58) Field of Classification Search
USPC .......................................................... 361/56
See application file for complete search history.

(56) References Cited

U.S. PATENT DOCUMENTS

| | | | |
|---|---|---|---|
| 6,064,249 A | 5/2000 | Duvvury et al. | |
| 6,385,028 B1 | 5/2002 | Kouno | |
| 6,614,633 B1* | 9/2003 | Kohno | H01L 27/0266 361/111 |
| 2005/0275027 A1* | 12/2005 | Mallikarjunaswamy | H01L 27/0266 257/355 |
| 2006/0028776 A1* | 2/2006 | Stockinger | H01L 27/0292 361/56 |
| 2006/0071236 A1* | 4/2006 | Jensen | H01L 29/7302 257/133 |
| 2008/0143180 A1* | 6/2008 | Ito | H02H 9/046 307/10.1 |
| 2011/0013325 A1 | 1/2011 | Kim | |

(Continued)

FOREIGN PATENT DOCUMENTS

| | | |
|---|---|---|
| JP | 2000-77537 A | 3/2000 |
| JP | 2002-324842 A | 11/2002 |

OTHER PUBLICATIONS

European Search Report dated Sep. 22, 2014.

*Primary Examiner* — Ronald W Leja
(74) *Attorney, Agent, or Firm* — McGinn IP Law Group, PLLC

(57) ABSTRACT

Provided is an ESD protection circuit including: a power MOS transistor provided between an external connection terminal and a reference voltage terminal; a clamping circuit that is provided between the external connection terminal and a gate of the power MOS transistor and clamps a voltage between the external connection terminal and the gate of the power MOS transistor at a predetermined value or less; a first resistive element provided between the gate and a source of the power MOS transistor; and a MOS transistor that is provided in series with the power MOS transistor and has a gate and a source which are commonly connected to each other.

19 Claims, 17 Drawing Sheets

(56) References Cited

U.S. PATENT DOCUMENTS

| | | |
|---|---|---|
| 2011/0121395 A1 | 5/2011 | Kim |
| 2012/0181611 A1 | 7/2012 | Akai |
| 2014/0085760 A1* | 3/2014 | Lui ............... H01L 27/0255 361/91.5 |
| 2014/0327079 A1* | 11/2014 | Etherton ......... H01L 27/0285 257/355 |
| 2015/0002965 A1* | 1/2015 | Hayashi .......... H01L 27/0266 361/56 |
| 2015/0270253 A1* | 9/2015 | Farbiz ............ H01L 27/0248 361/56 |

* cited by examiner

ESD PROTECTION CIRCUIT, SEMICONDUCTOR DEVICE, ON-VEHICLE ELECTRONIC DEVICE, AND ON-VEHICLE ELECTRONIC SYSTEM

CROSS-REFERENCE TO RELATED APPLICATIONS

This application is based upon and claims the benefit of priority from Japanese patent application No. 2013-136087, filed on Jun. 28, 2013, and Japanese patent application No. 2014-65602, filed on Mar. 27, 2014, the disclosure of which is incorporated herein in its entirety by reference.

BACKGROUND

The present invention relates to an ESD protection circuit, a semiconductor device, an on-vehicle electronic device, and an on-vehicle electronic system, and more particularly, to an ESD protection circuit, a semiconductor device, an on-vehicle electronic device, and an on-vehicle electronic system, which are suitable for, for example, achieving a highly precise ESD protection operation.

An ESD protection circuit that absorbs ESD (Electro-Static Discharge; surge voltage) to thereby prevent a protected circuit from being broken has recently been under development.

Related art is disclosed in Japanese Unexamined Patent Application Publication No. 2000-77537. A surge protecting circuit disclosed in Japanese Unexamined Patent Application Publication No 2000-77537 includes a power MOSFET, a gate drive circuit, which controls turning on/off of the power MOSFET, a Zener diode group, which is provided between a drain and a gate of the power MOSFET and causes a breakdown when a surge voltage is applied to the drain of the power MOSFET, and a resistive element, which is provided between the gate of the power MOSFET and the gate drive circuit and prevents a current from flowing from the gate of the power MOSFET to the gate drive circuit (see FIG. 13 of Japanese Unexamined Patent Application Publication No. 2000-77537). In this surge protecting circuit, when a surge voltage is applied to the drain of the power MOSFET and the Zener diode group causes a breakdown, the gate voltage of the power MOSFET increases and the power MOSFET turns on, so that the surge voltage is absorbed.

In addition, Japanese Unexamined Patent Application Publication No. 2002-324842 discloses a CMOS protection circuit that includes NMOS transistors as protection elements each having a drain connected to an input/output terminal and each having a gate and a source which are connected to a ground terminal (see FIG. 7 of Japanese Unexamined Patent Application Publication No. 2002-324842).

SUMMARY

In the surge protecting circuit disclosed in Japanese Unexamined Patent Application Publication No. 2000-77537, EMI noise transmitted to the drain of the power MOSFET during a normal operation may be transmitted to the gate of the power MOSFET through a parasitic capacitance that is formed between the gate and the drain of the power MOSFET. This causes a problem that the power MOSFET unintentionally turns on, and thus the surge protecting circuit cannot achieve a highly precise ESD protection operation.

When the resistance value of the resistive element, which is provided between the gate of the power MOSFET and the gate drive circuit, is reduced so as to avoid a malfunction due to the EMI noise, the influence of the EMI noise is reduced, but the rise of the gate voltage of the power MOSFET upon application of the surge voltage is slow (slow to react), which makes it difficult to achieve a sufficient ESD protection operation.

Thus, the surge protecting circuit disclosed in Japanese Unexamined Patent Application Publication No. 2000-77537 has a problem that it is difficult to achieve a highly precise ESD protection operation while suppressing occurrence of a malfunction due to the influence of the EMI noise. Other problems to be solved and novel features will be apparent from the description of the specification and the accompanying drawings.

A first aspect of the present invention is a semiconductor device including an ESD protection circuit provided to an external connection terminal. The ESD protection circuit includes: a power MOS transistor; a clamping circuit that clamps a voltage between the external connection terminal and a gate of the power MOS transistor at a predetermined value or less; a first resistive element provided between the gate and a source of the power MOS transistor; and a MOS transistor that is provided in series with the power MOS transistor and has a gate and a source which are commonly connected to each other.

A second aspect of the present invention is an on-vehicle electronic device including a semiconductor device and an arithmetic processing unit which are formed on a substrate. The semiconductor device includes an ESD protection circuit provided to an external connection terminal. The ESD protection circuit includes: a power MOS transistor; a clamping circuit that clamps a voltage between the external connection terminal and a gate of the power MOS transistor at a predetermined value or less; a resistive element provided between the gate and a source of the power MOS transistor; and a MOS transistor that is provided in series with the power MOS transistor and has a gate and a source which are commonly connected to each other.

A third aspect of the present invention is an on-vehicle electronic system including a semiconductor device and a controlled device. The semiconductor device includes an ESD protection circuit provided to an external connection terminal to which the controlled device is connected. The ESD protection circuit includes: a power MOS transistor; a clamping circuit that clamps a voltage between the external connection terminal and a gate of the power MOS transistor at a predetermined value or less; a resistive element provided between the gate and a source of the power MOS transistor; and a MOS transistor that is provided in series with the power MOS transistor and has a gate and a source which are commonly connected to each other.

A fourth aspect of the present invention is an ESD protection circuit including: a power MOS transistor having a high breakdown voltage and provided between an external connection terminal and a reference voltage terminal; a clamping circuit that is provided between the external connection terminal and a gate of the power MOS transistor and clamps a voltage between the external connection terminal and the gate of the power MOS transistor at a predetermined value or less; a first resistive element provided between the gate and a source of the power MOS transistor; and a MOS transistor that is provided in series with the power MOS transistor and has a gate and a source which are commonly connected to each other.

According to the first to fourth aspects of the present invention, it is possible to provide an ESD protection circuit, a semiconductor device, an on-vehicle electronic device, and an electronic system, which are capable of achieving a highly precise ESD protection operation on a protected circuit having a high breakdown voltage, while suppressing occurrence of a malfunction due to the influence of EMI noise.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
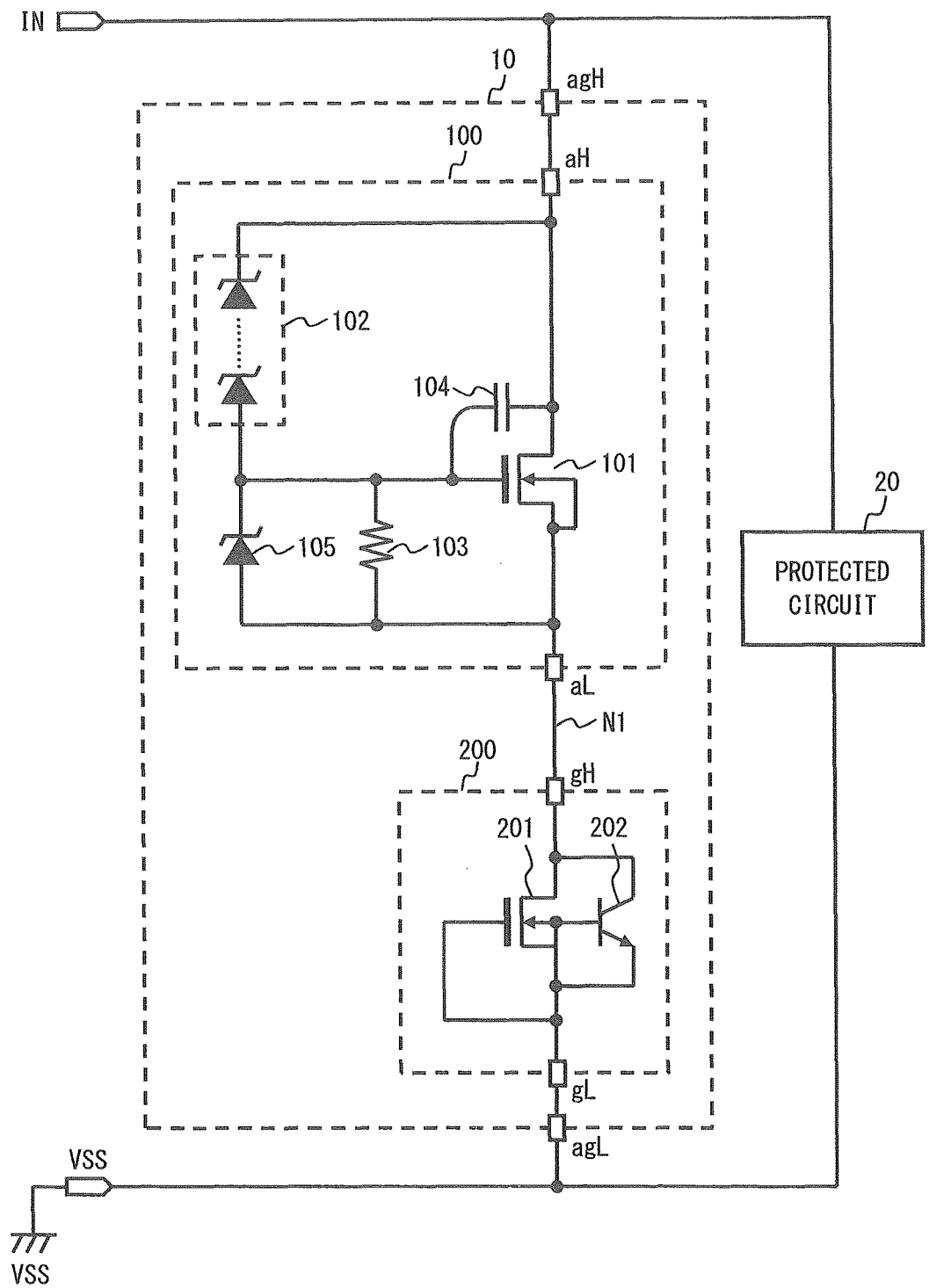
FIG. 1 is a diagram showing a configuration example of an ESD protection circuit according to a first embodiment.

Hereinafter, embodiments will be described with reference to the accompanying drawings. The drawings are made in a simplified manner, and therefore the technical scope of embodiments of the invention should not be narrowly interpreted based on the drawings. The same components are denoted by the same reference numerals, and a duplicate description thereof is omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of a part or all of the other, unless otherwise specified. Further, in the following embodiments, when a number of an element (including a number of items, numerical value, quantity, range, etc.) or the like is mentioned, the number is not limited to that specific number, and may be larger or smaller than the mentioned number, except for the case where it is explicitly indicated that the number should be the specifically-mentioned number, or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationship, or the like of the constituent elements are mentioned, they include substantially similar or analogous shapes and so forth, except for the case where it is explicitly indicated or it is theoretically clear that the above is not true. This also applies to the above-mentioned values (including a number of items, numerical value, quantity, range, etc.) and the like.

First Embodiment

An ESD protection circuit according to a first embodiment will be described. The ESD protection circuit according to the first embodiment includes a power MOS transistor, a clamping circuit, a first resistive element, and a bipolar transistor. The power MOS transistor is provided between an external input terminal and a reference voltage terminal. The clamping circuit clamps the voltage of the external input terminal at a predetermined value or less. The first resistive element is provided between a gate and a source of the power MOS transistor. The bipolar transistor is provided in series with the power MOS transistor and has a base and an emitter which are connected to each other. With this configuration, the ESD protection circuit according to the first embodiment can achieve a highly precise ESD protection operation on a protected circuit having a high breakdown voltage, while suppressing occurrence of a malfunction due to the influence of EMI noise. This will be described in detail below.

(Configuration of an ESD Protection Circuit 10 According to the First Embodiment)

FIG. 1 is a diagram showing a configuration example of the ESD protection circuit 10 according to the first embodiment. FIG. 1 also shows a protected circuit 20 which is a protection target of the ESD protection circuit 10.

The ESD protection circuit 10 and the protected circuit 20 are provided in parallel between an external input terminal (external connection terminal) IN which is externally supplied with an input voltage and a reference voltage terminal (hereinafter referred to as a reference voltage terminal VSS) which is supplied with a reference voltage VSS.

The ESD protection circuit 10 absorbs ESD (surge voltage) which is applied to the external input terminal IN, thereby protecting the protected circuit 20 having a high breakdown voltage against the ESD. The ESD protection circuit 10 is adjusted to clamp the voltage of the external input terminal IN when the voltage value of the external input terminal IN is larger than a maximum rating of the protecting circuit 20 and reaches a predetermined voltage value which is smaller than the breakdown voltage of the protected circuit 20. The first embodiment illustrates a case where the maximum rating of the protected circuit 20 is 40 V and the breakdown voltage of the protected circuit 20 is about 65 V. A circuit having a breakdown voltage within the range of the protection operation of the ESD protection circuit 10 is referred to as a high-breakdown-voltage circuit.

The ESD protection circuit 10 includes a protection block 100 and a protection block 200. The protection block 100 includes a power MOS transistor 101, a clamping circuit 102, a resistive element (first resistive element) 103, and a Zener diode 105. The protection block 200 includes a MOS transistor 201.

A high-voltage terminal of the ESD protection circuit 10 is represented by agH, and a low-voltage terminal of the ESD protection circuit 10 is represented by agL. A high-voltage terminal of the protection block 100 is represented by aH, and a low-voltage terminal of the protection block 100 is represented by aL. A high-voltage terminal of the protection block 200 is represented by gH, and a low-voltage terminal of the protection block 200 is represented by gL. In the following description, these terminals may be abbreviated.

The protection block 100 and the protection block 200 are connected in series between the high-voltage terminal agH and the low-voltage terminal agL of the ESD protection circuit 10. More specifically, the ESD protection circuit 10 connects the external input terminal IN to the high-voltage terminal agH, and connects the reference voltage terminal VSS to the low-voltage terminal agL. The protection block 100 connects the high-voltage terminal aH to the high-voltage terminal agH of the ESD protection circuit 10, and connects the low-voltage terminal aL to the high-voltage terminal gH of the protection block 200. The protection block 200 connects the low-voltage terminal gL to the low-voltage terminal agL of the ESD protection circuit 10.

The power MOS transistor 101 is, for example, an N-channel type power MOS transistor, and is provided between the external input terminal IN and the reference voltage terminal VSS. More specifically, the power MOS transistor 101 has a drain connected to the external input terminal IN (through the high-voltage terminal aH of the protection block 100 and the high-voltage terminal agH of the ESD protection circuit 10), and a source connected to a node N1 (through the low-voltage terminal aL of the protection block 100). A parasitic capacitive element 104 is formed between a gate and the drain of the power MOS transistor 101.

The clamping circuit 102 is provided between the gate of the power MOS transistor 101 and the external input terminal IN. More specifically, the clamping circuit 102 includes a plurality of Zener diodes that are connected in series. An anode side of the clamping circuit 102 is connected to the gate of the power MOS transistor 101, and a cathode side of the clamping circuit 102 is connected to the external input terminal IN (through the high-voltage terminal aH of the protection block 100 and the high-voltage terminal agH of the ESD protection circuit 10).

The clamping circuit 102 clamps a high voltage, which is applied to the external input terminal IN, at a predetermined value or less. More specifically, when the voltage of the external input terminal IN increases and the voltage between the gate and the drain of the power MOS transistor 101 is larger than a clamping voltage (predetermined value), the clamping circuit 102 causes a breakdown. At this time, a breakdown current flowing through the resistive element 103 causes a voltage drop. As a result, the voltage between the gate and the source of the power MOS transistor 101 increases and the power MOS transistor 101 turns on. Accordingly, the voltage of the external input terminal IN is clamped in the vicinity of the predetermined value and does not increase any more. This prevents an overvoltage from being applied to the protected circuit 20 (a protection operation state is set).

The resistive element 103 is provided between the gate and the source of the power MOS transistor 101. The resistive element 103 allows a gate voltage of the power MOS transistor 101 to be biased to a source voltage in the state where the clamping circuit 102 does not cause breakdown (non-protection operation state). This prevents the power MOS transistor 101 from unintentionally turning on in the non-protection operation state.

The resistive element 103 has a relatively high resistance value. Accordingly, since a voltage drop (current value× resistance value) at a certain current value can be increased, when the clamping circuit 102 causes a breakdown due to the application of ESD, for example, the voltage between the gate and the source of the power MOS transistor 101 can be rapidly increased to turn on the power MOS transistor 101.

The Zener diode 105 is provided in parallel with the resistive element 103 between the gate and the source of the power MOS transistor 101. The Zener diode 105 clamps the voltage between the gate and the source of the power MOS transistor 101 at a predetermined value or less. More specifically, when the gate voltage of the power MOS transistor 101 increases and the voltage between the gate and the source of the power MOS transistor 101 is larger than the predetermined value, the Zener diode 105 causes a breakdown. This prevents the gate voltage of the power MOS transistor 101 from being excessively increased, and prevents the gate insulating film of the power MOS transistor 101 and the resistive element 103 from being broken and causing a failure due to an overvoltage. If the gate insulation film of the power MOS transistor 101 and the resistive element 103 have a sufficient resistance to an assumed ESD voltage and time (profile), the Zener diode 105 is not essential.

The MOS transistor 201 is, for example, an N-channel type MOS transistor, and is provided in series with the power MOS transistor 101. More specifically, the MOS transistor 201 has a gate and a source which are connected to the reference voltage terminal VSS (through the low-voltage terminal gL of the protection block 200 and the low-voltage terminal agL of the ESD protection circuit 10), and a drain connected to the node N1 (through the high-voltage terminal gH of the protection block 200).

An NPN-type parasitic bipolar transistor 202 is formed at the MOS transistor 201. The parasitic bipolar transistor 202 has a base connected to a backgate of the MOS transistor 201, a collector connected to the drain of the MOS transistor 201, and an emitter connected to the source of the MOS transistor 201. In practice, the base and the emitter of the parasitic bipolar transistor 202 are connected through a parasitic resistance formed at the MOS transistor 201.

Next, the operation of the ESD protection circuit 10 will be described. First, the operation of a single protection block 100 and a single protection block 200 will be described in order to compare it with the operation of the ESD protection circuit 10 according to the first embodiment.

(Operation of a Single Protection Block 100)

Figure 2A:
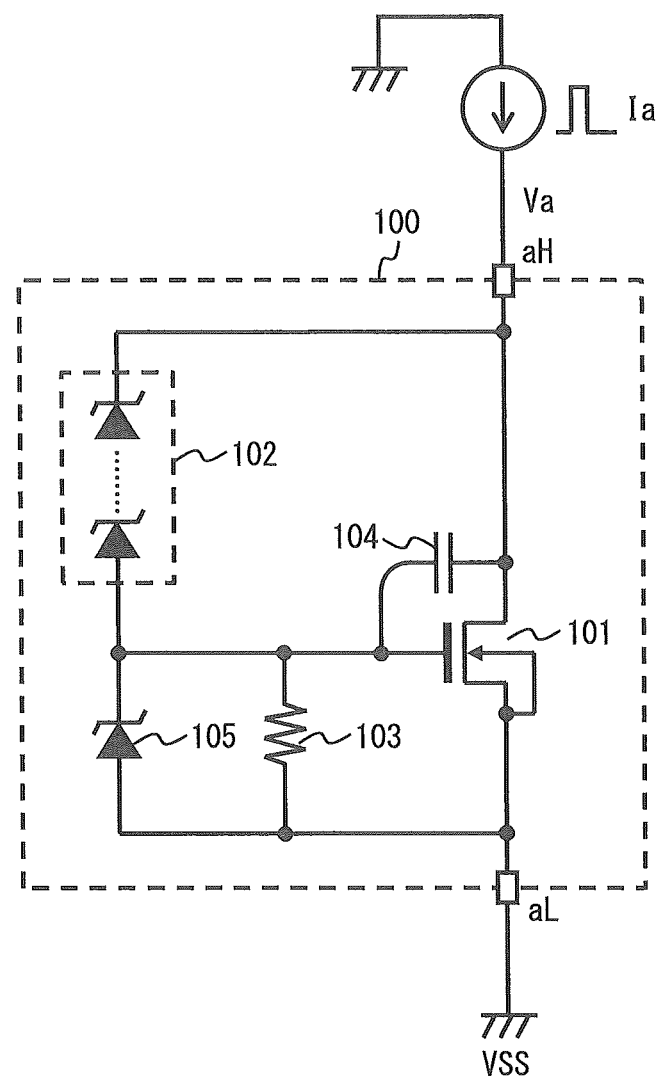
FIG. 2A is a diagram showing a configuration example of a single protection block 100.

FIG. 2A is a diagram showing a configuration example of a single protection block 100. The protection block 100 shown in FIG. 2A has a configuration as described above. In the example of FIG. 2A, the high-voltage terminal aH of the protection block 100 is supplied with a voltage Va, and the low-voltage terminal aL of the protection block 100 is supplied with the reference voltage VSS (ground voltage).

Figure 2B:
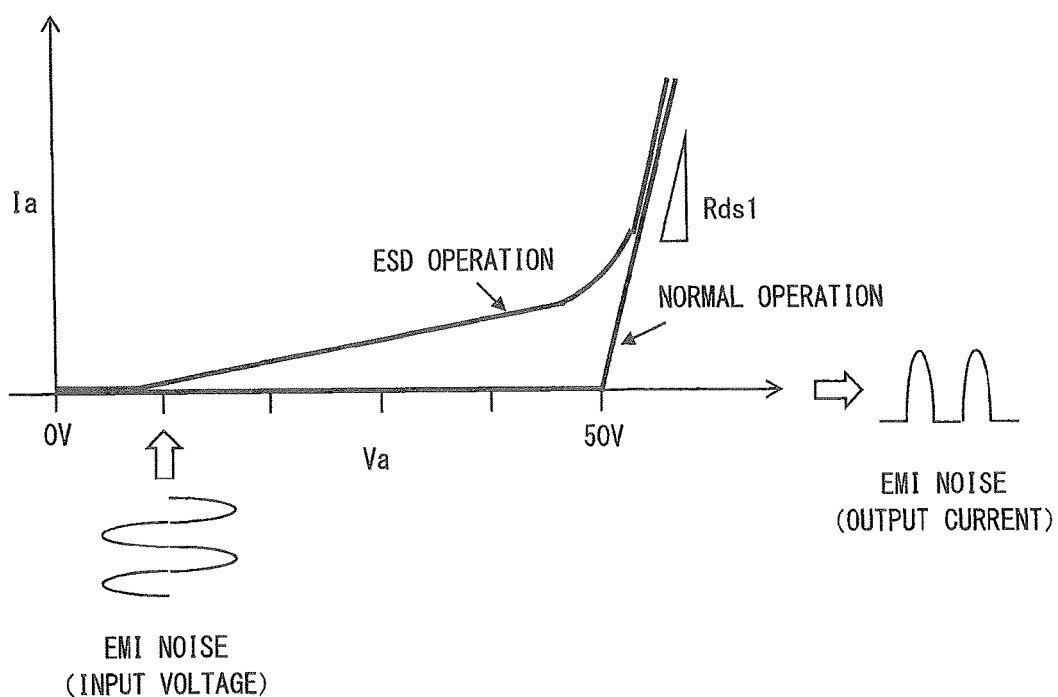
FIG. 2B is a graph showing operating characteristics of a single protection block 100.

FIG. 2B is a graph showing operation characteristics of a single protection block 100 shown in FIG. 2A. Note that "ESD operation" shown in FIG. 2B indicates a relationship between the instantaneous high voltage Va (corresponding to ESD), which is applied to the high-voltage terminal aH, and a current Ia flowing through the protection block 100, and "normal operation" shown in FIG. 2B indicates a relationship between the gently fluctuating voltage Va (corresponding to an input voltage supplied to the external input terminal IN during the normal operation), which is applied to the high-voltage terminal aH, and the current Ia flowing through the protection block 100. It can be said that the ESD operation is a high-speed operation (a large rate of change in voltage=a large high frequency component of voltage) and that the normal operation is a low-speed operation (a small rate of change in voltage=a small high frequency component of voltage).

First, the ESD operation will be described. In the ESD operation, when the drain voltage of the power MOS transistor 101 starts to rise, the high frequency component thereof flows to the resistive element 103 through the parasitic capacitive element 104, which causes a voltage drop. Accordingly, the voltage between the gate and the source of the power MOS transistor 101 also starts to rise. As a result, the on-resistance of the power MOS transistor 101 starts to drop, so that a current starts to flow between the source and the drain of the power MOS transistor 101.

When the drain voltage of the power MOS transistor 101 further increases and the voltage between the gate and the drain of the power MOS transistor 101 is larger than the clamping voltage (in the vicinity of 50 V in this example) of the clamping circuit 102, the clamping circuit 102 causes a breakdown. Accordingly, a breakdown current flowing through the resistive element 103 causes a voltage drop, so that the voltage between the gate and the source of the power MOS transistor 101 further increases rapidly. As a result, the on-resistance of the power MOS transistor 101 further decreases, so that a large current flows between the source and the drain of the power MOS transistor 101. In other words, an ESD current is absorbed by the power MOS transistor 101.

Next, the normal operation will be described. In the normal operation, even when the drain voltage of the power MOS transistor 101 starts to rise, the high frequency component is small because the voltage fluctuation is smoother than that during the ESD operation, and thus almost no current flows through the parasitic capacitive element 104. Accordingly, no current flows through the resistive element 103, so that the voltage between the gate and the source of the power MOS transistor 101 is maintained at 0 V. Thus, since the power MOS transistor 101 is maintained in an off state, no current flows between the source and the drain of the power MOS transistor 101.

When the drain voltage of the power MOS transistor 101 further increases and the voltage between the gate and the drain of the power MOS transistor 101 is larger than the clamping voltage (in the vicinity of 50 V in this example) of the clamping circuit 102, the clamping circuit 102 causes a breakdown. Accordingly, a breakdown current flowing through the resistive element 103 causes a voltage drop, so that the voltage between the gate and the source of the power MOS transistor 101 rapidly increases. As a result, the power MOS transistor 101 turns on, and a large current flows between the source and the drain of the power MOS transistor 101. In other words, an overvoltage generated during the normal operation is clamped by the power MOS transistor 101.

The operation of a single protection block 100 when the EMI noise is applied to the high-voltage terminal aH during the normal operation will now be described. The EMI noise has a voltage value smaller than that of the ESD noise, but similarly to the ESD noise, the EMI noise includes a number of high frequency components. In this case, the high frequency components of the EMI noise, which are transmitted to the drain of the power MOS transistor 101, flow through the parasitic capacitive element 104 and the resistive element 103 and cause a voltage drop in the resistive element 103. Thus, the high frequency components are transmitted to the gate of the power MOS transistor 101. This causes the power MOS transistor 101 to unintentionally turn on, which leads to a problem that a highly precise ESD protection operation cannot be achieved.

When the resistance value of the resistive element 103 is reduced to thereby reduce the value of the voltage drop so as to avoid a malfunction due to the EMI noise, the influence of the EMI noise is reduced, but the rise of the gate voltage of the power MOS transistor 101 upon application of the ESD is slow (slow to response), which makes it difficult to achieve a sufficient ESD protection operation. Therefore, the measures for reducing the resistance value of the resistive element 103 have limitations.

In this manner, in a single protection block 100, when the resistance value of the resistive element 103 is increased, the EMI noise resistance decreases, and when the resistance value of the resistive element 103 is reduced, the ESD resistance decreases. In other words, in a single protection block 100, the EMI noise resistance and the ESD resistance are in a tradeoff relationship, which makes it difficult to satisfy both the EMI noise resistance and the ESD resistance. Such a problem becomes more conspicuous because a voltage sensitivity between the gate and the drain of the power MOS transistor by the parasitic capacitive element formed between the gate and the drain of the power MOS transistor is increased along with a decrease in threshold voltage of the power MOS transistor and a reduction in the length of the source thereof.

(Operation of a Single Protection Block 200)

Figure 3A:
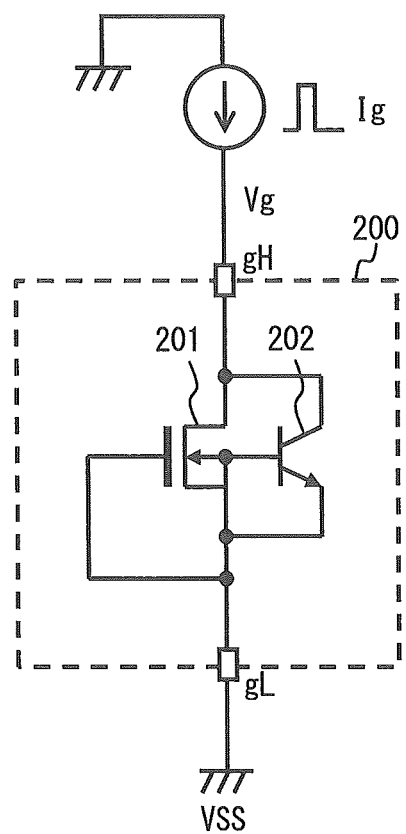
FIG. 3A is a diagram showing a configuration example of a single protection block 200.

FIG. 3A is a diagram showing a configuration example of a single protection block 200. The protection block 200 shown in FIG. 3A has a configuration as described above. In the example of FIG. 3A, the high-voltage terminal gH of the protection block 200 is supplied with a voltage Vg, and the low-voltage terminal gL of the protection block 200 is supplied with the reference voltage VSS (ground voltage).

Figure 3B:
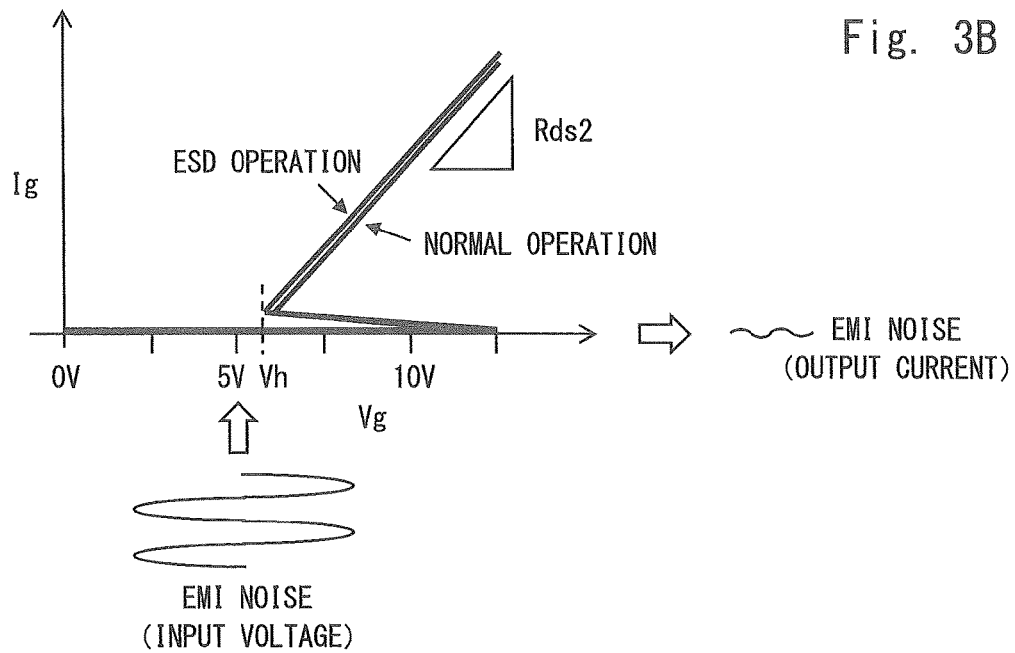
FIG. 3B is a graph showing operating characteristics of a single protection block 200.

FIG. 3B is a graph showing operating characteristics of a single protection block 200 shown in FIG. 3A. Note that "ESD operation" shown in FIG. 3B indicates a relationship between the instantaneous high voltage Vg (corresponding to ESD), which is applied to the high-voltage terminal gH, and a current Ig flowing through the protection block 200, and "normal operation" shown in FIG. 3B indicates a relationship between the gently fluctuating voltage Vg (corresponding to an input voltage supplied to the external input terminal IN during the normal operation), which is applied to the high-voltage terminal gH, and the current Ig flowing through the protection block 200.

As shown in FIG. 3B, the operating characteristics exhibited by a single protection block 200 in the ESD operation are similar to those exhibited by it in the normal operation. Specifically, the MOS transistor 201 is maintained in an off state (high impedance) until the drain voltage of the MOS transistor 201 reaches a trigger voltage (about 12.5 V in this example), and thus no current flows between the source and the drain of the MOS transistor 201. When the drain voltage of the MOS transistor 201 reaches the trigger voltage, the parasitic bipolar transistor 202 operates after the MOS transistor 201 causes a breakdown, so that a snap-back phenomenon occurs. This causes a current to flow between the source and the drain of the MOS transistor 201.

In this case, even when the EMI noise is applied to the high-voltage terminal gH, no current flows between the source and the drain of the MOS transistor 201, unless the drain voltage of the MOS transistor 201 reaches the trigger voltage. In other words, the MOS transistor 201 is not unintentionally turned on due to the EMI noise.

In this case, however, since a single protection block 200 is used for a low breakdown voltage (about 12.5 V in this example), it is impossible for a single protection block 200 to protect the high-breakdown-voltage power MOS transistor, which is provided in the protected circuit 20, against the ESD.

Therefore, the ESD protection circuit 10 according to the first embodiment uses a combination of the protection blocks 100 and 200, thereby achieving a highly precise ESD protection operation on the high-breakdown-voltage protected circuit 20, while suppressing occurrence of a malfunction due to the influence of the EMI noise.

(Operation of the ESD Protection Circuit 10 According to the First Embodiment)

Figure 4:
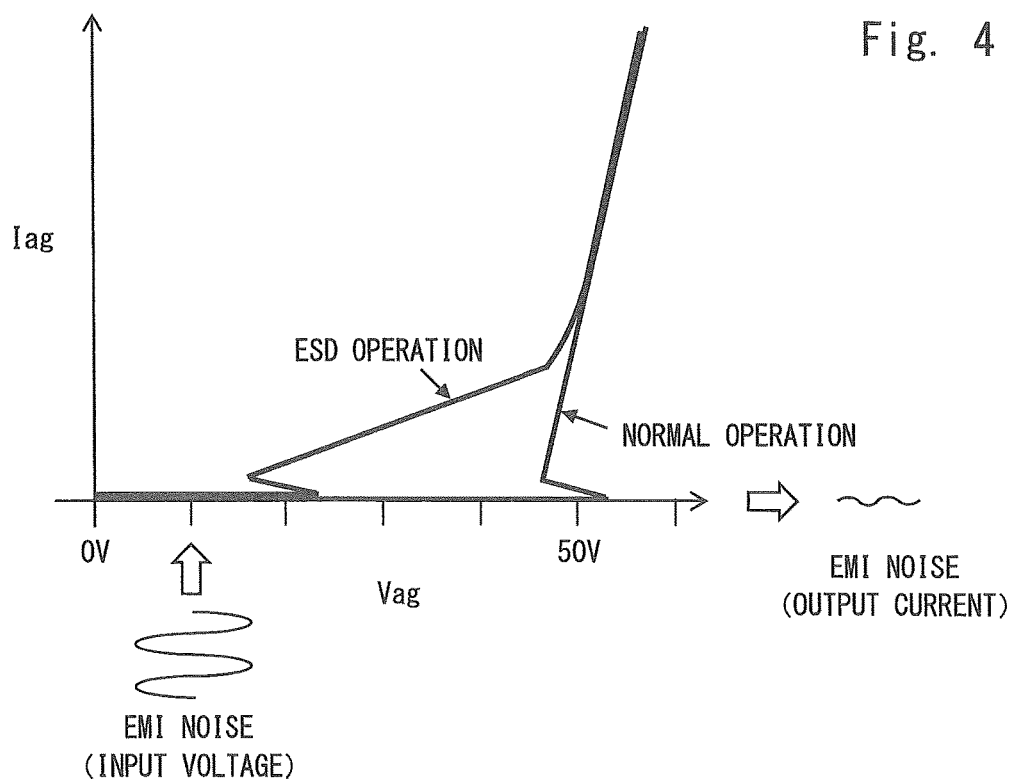
FIG. 4 is a graph showing operating characteristics of the ESD protection circuit according to the first embodiment.

The operation of the ESD protection circuit 10 shown in FIG. 1 will be described below with reference to FIG. 4. FIG. 4 is a graph showing operating characteristics of the ESD protection circuit 10. Note that "ESD operation" shown in FIG. 4 indicates a relationship between an instantaneous high voltage Vag (corresponding to ESD), which is applied to the external input terminal IN, and a current Iag flowing through the ESD protection circuit 10, and "normal operation" shown in FIG. 4 indicates a relationship between the input voltage Vag, which is supplied to the external input terminal IN during the normal operation, and the current Iag flowing through the ESD protection circuit 10.

First, the ESD operation will be described. In the ESD operation, when the drain voltage of the power MOS transistor 101 starts to rise in accordance with an increase in voltage of the external input terminal IN, the gate voltage of the power MOS transistor 101 also starts to rise due to the influence of the parasitic capacitive element 104. However, the MOS transistor 201 is maintained in an off state (high impedance) until the drain voltage of the MOS transistor 201 reaches the trigger voltage (about 25 V in this example). Accordingly, no current flows through the resistive element 103 and no voltage drop occurs, so that the voltage between the gate and the source of the power MOS transistor 101 is maintained at 0 V and the power MOS transistor 101 does not turn on. Since the power MOS transistor 101 is in the off state and the MOS transistor 201 is also in the off state, no current flows through the ESD protection circuit 10 during this period.

When the voltage of the external input terminal IN further increases and the drain voltage of the MOS transistor 201 reaches the trigger voltage, the MOS transistor 201 causes a breakdown. After that, when the parasitic bipolar transistor 202 operates, the snap-back phenomenon occurs, so that a current starts to flow through the protection block 200. Then, along with an increase in voltage of the external input terminal IN, a current generated due to the high frequency components flows through the parasitic capacitive element 104 and the resistive element 103. As a result, the voltage between the gate and the source of the power MOS transistor 101 increases due to a voltage drop of the resistive element 103, which causes a current to flow through the ESD protection circuit 10.

When the voltage of the external input terminal IN further increases and the drain voltage of the power MOS transistor 101 further increases, the voltage between the gate and the drain of the power MOS transistor 101 becomes larger than the clamping voltage of the clamping circuit 102. At this time, the clamping circuit 102 causes a breakdown and the breakdown current flows through the resistive element 103. Accordingly, the voltage between the gate and the source of the power MOS transistor 101 further increases rapidly. As a result, the on-resistance of the power MOS transistor 101 further decreases, so that a large current (ESD protection current) flows through the ESD protection circuit 10. In other words, the ESD current is absorbed by the ESD protection circuit 10.

Next, the normal operation will be described. In the normal operation, even when the drain voltage of the power MOS transistor 101 starts to rise in accordance with an increase in voltage of the external input terminal IN, the high frequency component is small because the voltage fluctuation is smoother than that during the ESD operation, and thus almost no current flows through the parasitic capacitive element 104. Accordingly, no current flows through the resistive element 103, so that the voltage between the gate and the source of the power MOS transistor 101 is maintained at 0 V. Thus, since the power MOS transistor 101 is maintained in an off state, no current flows through the ESD protection circuit 10.

When the voltage of the external input terminal IN further increases and the drain voltage of the power MOS transistor 101 further increases, the voltage between the gate and the drain of the power MOS transistor 101 becomes larger than the clamping voltage of the clamping circuit 102. At this time, the clamping circuit 102 causes a breakdown. Then the drain voltage of the MOS transistor 201 rapidly increases and exceeds the trigger voltage of the MOS transistor 201, so that the protection block 200 turns on. As a result, the breakdown current of the clamping circuit 102 flows through the resistive element 103. Accordingly, the voltage between the gate and the source of the power MOS transistor 101 rapidly increases, so that the power MOS transistor 101 turns on. Since the power MOS transistor 101 and the MOS transistor 201 turn on, a large current flows through the ESD protection circuit 10. In other words, an overcurrent generated during the normal operation is absorbed by the ESD protection circuit 10.

The operation of the ESD protection circuit 10 when the EMI noise is applied to the external input terminal IN during the normal operation will now be described. In this case, the EMI noise transmitted to the drain of the power MOS transistor 101 is transmitted to the gate of the power MOS transistor 101 through the parasitic capacitive element 104. However, since the MOS transistor 201 maintains a high impedance, no current flows through the ESD protection circuit 10. In other words, no current unintentionally flows through the ESD protection circuit 10 due to the EMI noise.

The ESD protection voltage (voltage at which a large current flows through the ESD protection circuit 10) of the protection circuit 10 is the sum of the clamping voltage of the clamping circuit 102 and the trigger voltage of the power MOS transistor 101. In this example, the sum of the clamping voltage of the clamping circuit 102 and the trigger voltage of the MOS transistor 201 is about 50 V.

In this manner, the ESD protection circuit 10 according to the first embodiment uses a combination of the protection blocks 100 and 200, thereby achieving a highly precise ESD protection operation on the high-breakdown-voltage protected circuit 20, while suppressing occurrence of a malfunction due to the influence of the EMI noise. In other words, the ESD protection circuit according to the first embodiment can satisfy both the EMI noise resistance and the ESD resistance.

The ESD protection circuit 10 may be directly provided with a bipolar transistor having the same conductivity type and connection relation as those of the parasitic bipolar transistor 202, instead of being provided with the MOS transistor 201.

Figure 5:
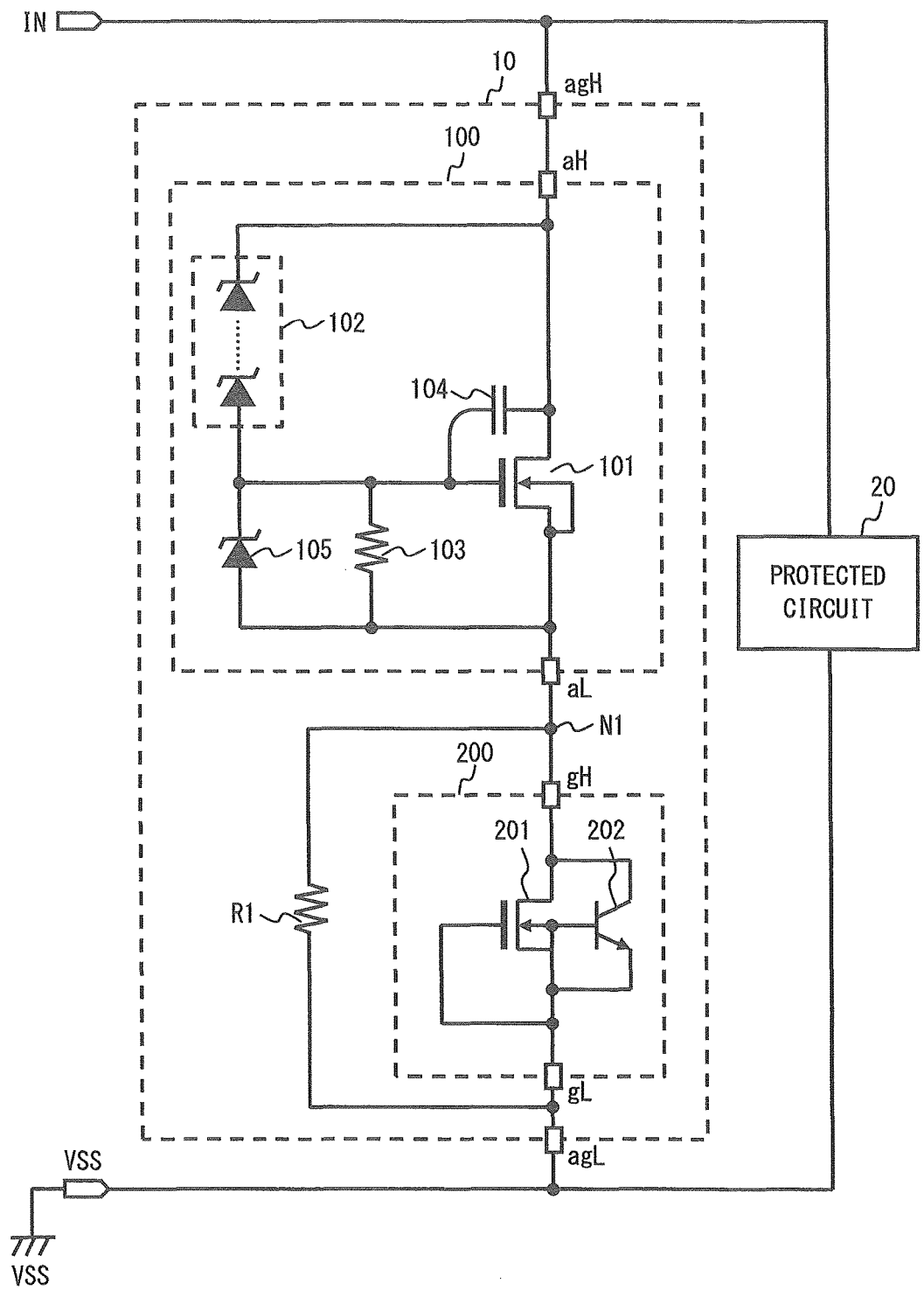
FIG. 5 is a diagram showing a modified example of the ESD protection circuit according to the first embodiment.

As shown in FIG. 5, the ESD protection circuit 10 may further include a resistive element (second resistive element) R1 that is connected in parallel with the protection block 200. This makes it possible to stabilize the initial bias of the node N1.

Second Embodiment

Figure 6:
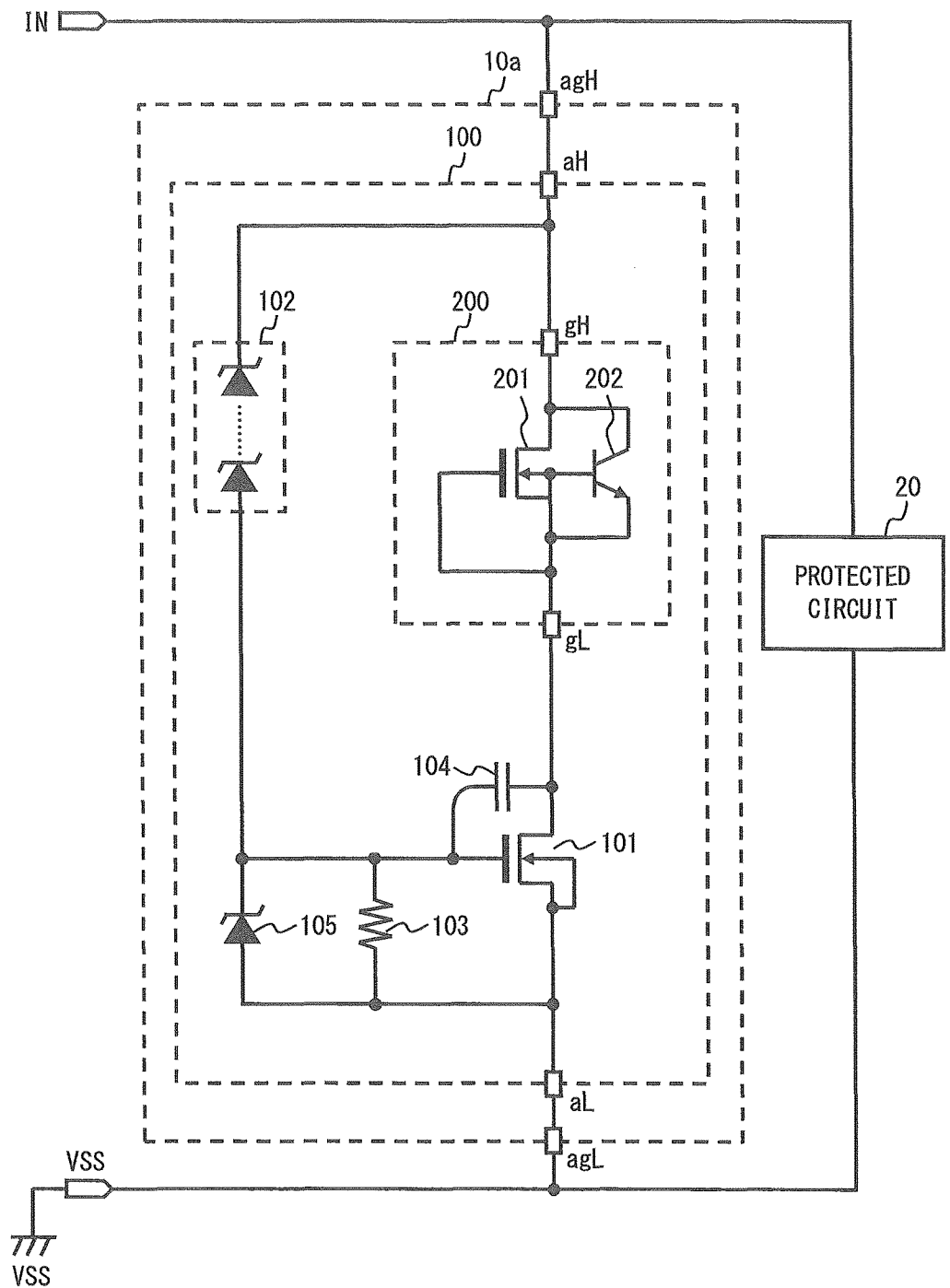
FIG. 6 is a diagram showing a configuration example of an ESD protection circuit according to a second embodiment.

FIG. 6 is a diagram showing a configuration example of an ESD protection circuit 10a according to a second embodiment. FIG. 6 also shows the protected circuit 20 which is a protection target of the ESD protection circuit 10a. Unlike the ESD protection circuit 10 shown in FIG. 1, the ESD protection circuit 10a shown in FIG. 6 includes the protection block 200 in the protection block 100.

More specifically, the gate and the source of the MOS transistor 201 provided in the protection block 200 are connected to the drain of the power MOS transistor 101, and the drain of the MOS transistor 201 is connected to the external input terminal IN.

In the MOS transistor 201, the parasitic bipolar transistor 202 is formed. The parasitic bipolar transistor 202 has a base connected to the backgate of the MOS transistor 201, a collector connected to the drain of the MOS transistor 201, and an emitter connected to the source of the MOS transistor 201. The base and the emitter of the MOS transistor 201 are connected through a parasitic resistance formed at the MOS transistor 201.

The other components of the ESD protection circuit 10a shown in FIG. 6 are similar to those of the ESD protection circuit 10 shown in FIG. 1, so the description thereof is omitted.

(Operation of the ESD Protection Circuit 10a According to the Second Embodiment)

Figure 7:
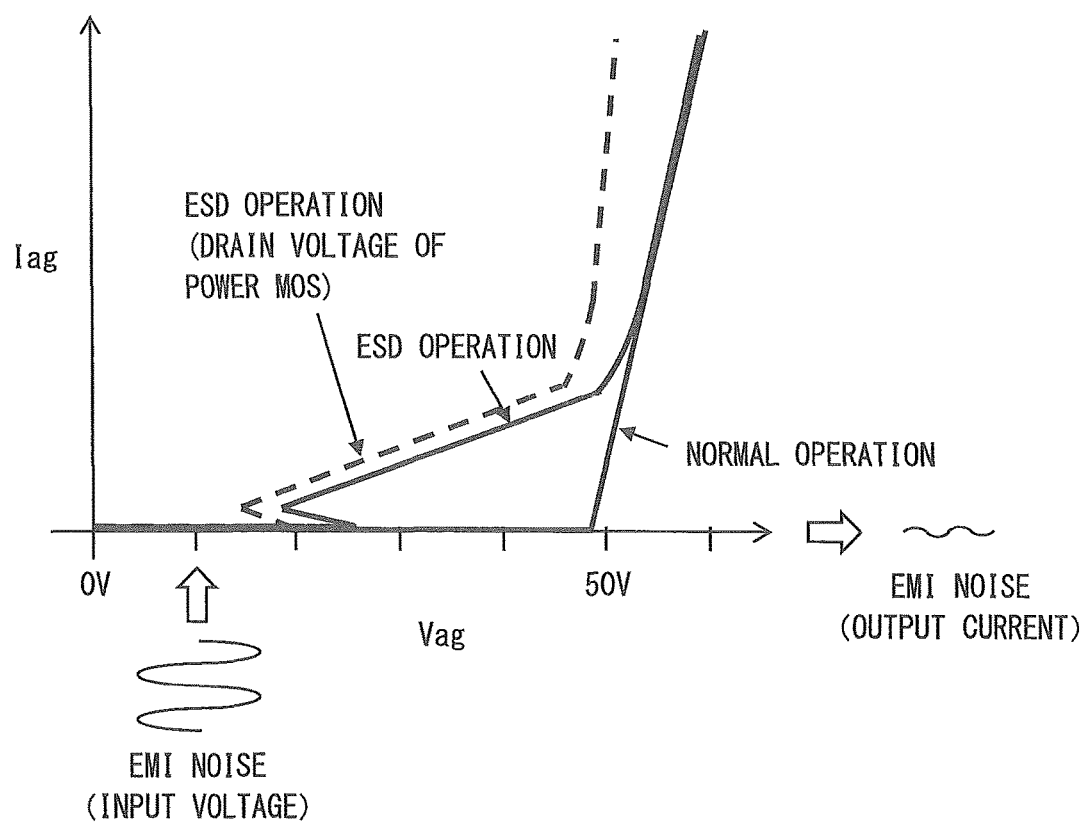
FIG. 7 is a graph showing operating characteristics of the ESD protection circuit according to the second embodiment.

Referring next to FIG. 7, the operation of the ESD protection circuit 10a shown in FIG. 6 will be described. FIG. 7 is a graph showing operating characteristics of the ESD protection circuit 10a. The dashed line shown in FIG. 7 represents a relationship between the drain voltage of the power MOS transistor 101 during the ESD operation and the current Tag flowing through the ESD protection circuit 10a.

First, the ESD operation will be described. In the ESD operation, even when the voltage of the external input terminal IN increases, no current flows through the ESD protection circuit 10a, because the MOS transistor 201 is maintained in an off state (high impedance) until the drain voltage of the MOS transistor 201 reaches a trigger voltage (about 25 V in this example).

When the voltage of the external input terminal IN further increases and the drain voltage of the MOS transistor 201 reaches the trigger voltage, the MOS transistor 201 causes a breakdown. After that, when the parasitic bipolar transistor 202 operates, the snap-back phenomenon occurs, so that a current starts to flow through the protection block 200. Then a current flows through the parasitic capacitive element 104 and the resistive element 103, so that the voltage between the gate and the source of the power MOS transistor 101 starts to rise due to a voltage drop of the resistive element 103. As a result, a current starts to flow through the ESD protection circuit 10a.

When the voltage of the external input terminal IN further increases and the voltage between the external input terminal IN and the gate of the power MOS transistor 101 is larger than the clamping voltage (in the vicinity of 50 V in this example) of the clamping circuit 102, the clamping circuit 102 causes a breakdown and the breakdown current flows through the resistive element 103. Accordingly, the voltage between the gate and the source of the power MOS transistor 101 further increases rapidly. As a result, the on-resistance of the power MOS transistor 101 further decreases, so that a large current (ESD protection current) flows through the ESD protection circuit 10a. In other words, the ESD current is absorbed by the ESD protection circuit 10a.

Referring now to FIG. 7, it is apparent that the drain voltage (indicated by the dashed line) of the power MOS transistor 101 is lower than the voltage Vag of the external input terminal IN by the amount corresponding to the voltage drop of the MOS transistor 201. The advantageous effect of the above in the ESD protection circuit 10a will be briefly described below.

Figure 8A:
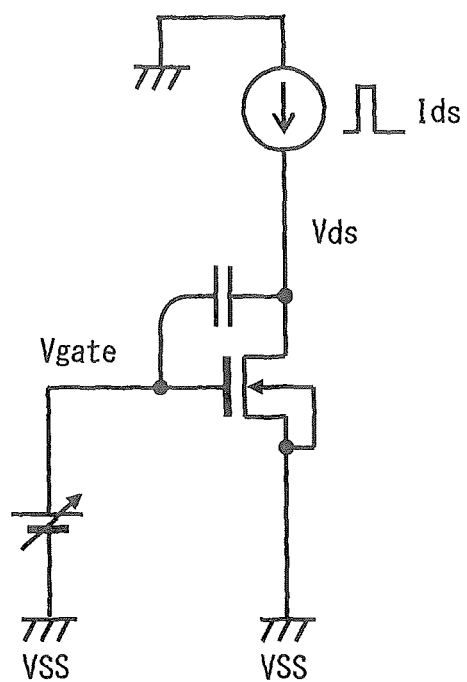
FIG. 8A is a diagram showing a configuration example of a power MOS transistor.

FIG. 8A is a diagram showing a configuration example of a single power MOS transistor. In the example of FIG. 8A, the power MOS transistor has a source supplied with a voltage Vds, a drain supplied with the reference voltage VSS (ground voltage), and a gate supplied with a variable voltage Vgate.

Figure 8B:
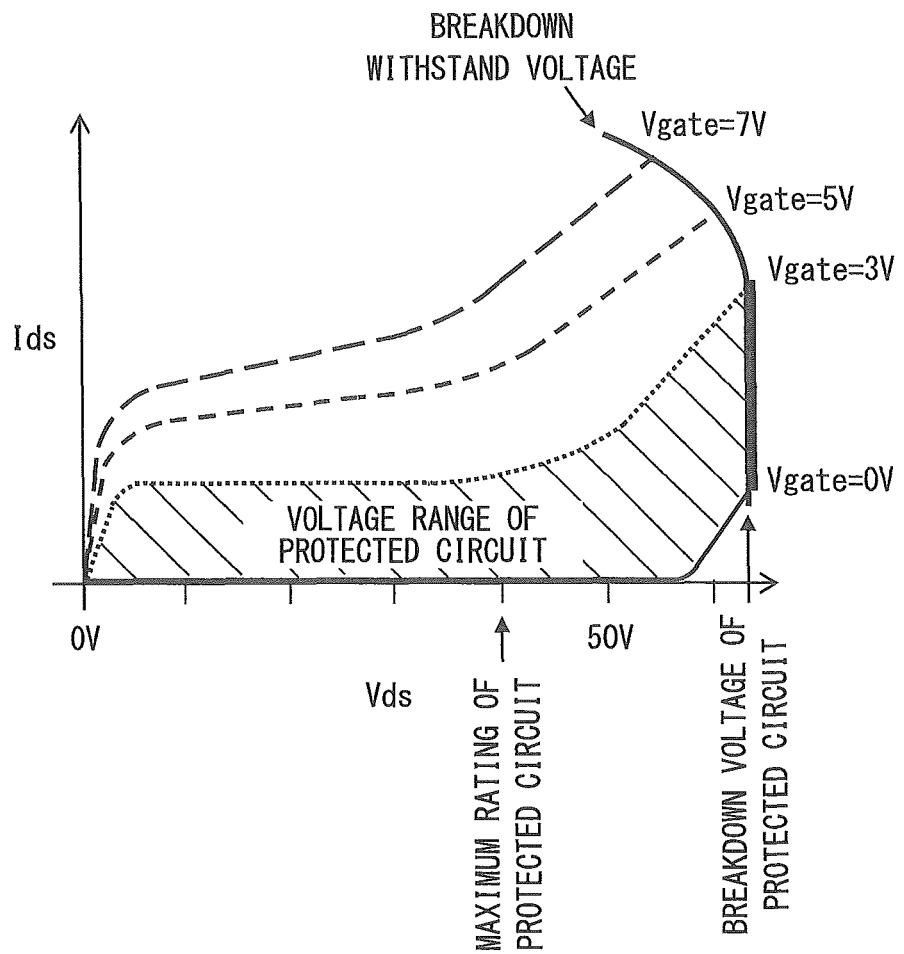
FIG. 8B is a graph showing operating characteristics of the power MOS transistor.

FIG. 8B is a graph showing operating characteristics of a single power MOS transistor shown in FIG. 8A. As shown in FIG. 8B, the power MOS transistor has a feature that as the gate voltage Vgate increases, a breakdown voltage between the source and the drain decreases and a drain current Ids increases.

Figure 9:
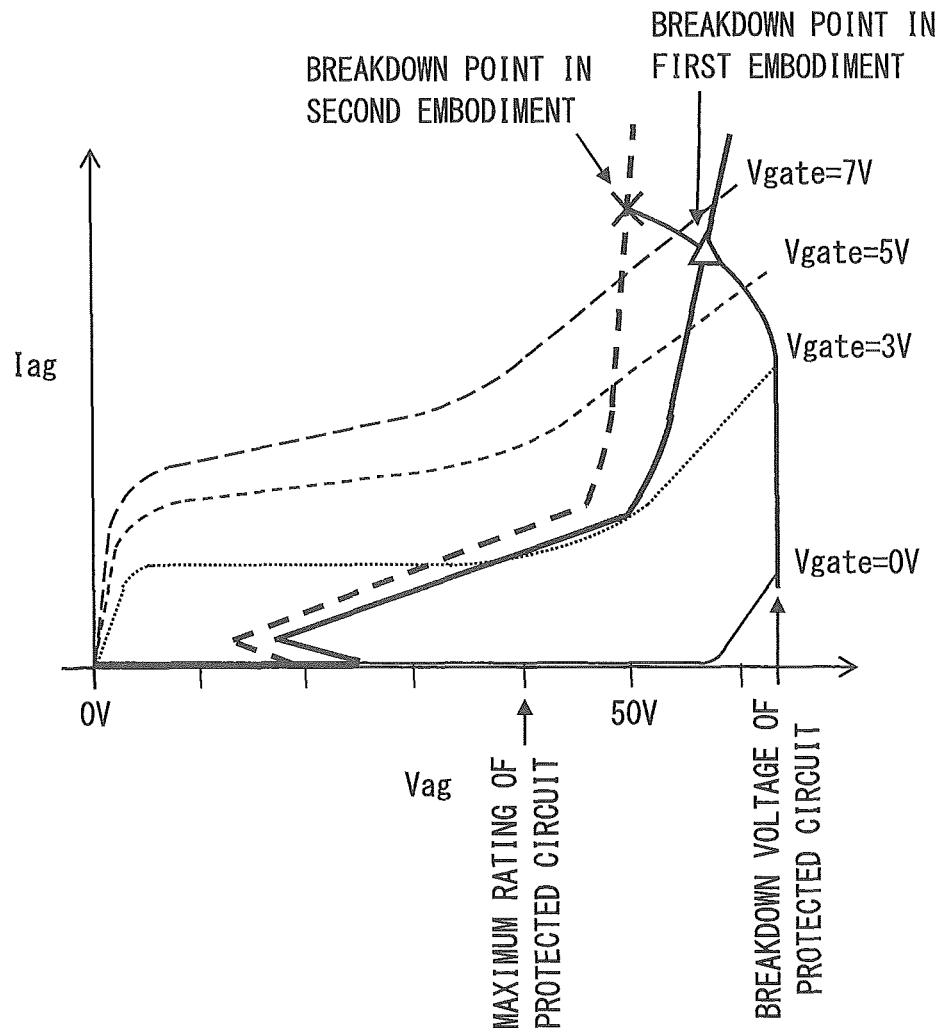
FIG. 9 is a graph for explaining effects of the ESD protection circuit according to the second embodiment.

In the ESD protection circuit 10a shown in FIG. 6, the drain voltage of the power MOS transistor 101 is suppressed to be lower than that of the ESD protection circuit 10 shown in FIG. 1. Accordingly, as shown in FIG. 9, in the ESD protection circuit 10a, the gate voltage of the power MOS transistor 101 can be increased to thereby increase the drain current, unlike in the ESD protection circuit 10. In other words, the ESD current can be effectively absorbed.

Returning to FIG. 7, the normal operation will now be described. In the normal operation, even when the voltage of the external input terminal IN increases, no current flows through the ESD protection circuit 10a, because the power MOS transistor 101 is maintained in an off state (high impedance) until the voltage between the external input terminal IN and the gate of the power MOS transistor 101 is larger than the clamping voltage (in the vicinity of 50 V in this example) of the clamping circuit 102.

When the voltage of the external input terminal IN further increases and the voltage between the external input terminal IN and the gate of the power MOS transistor 101 is larger than the clamping voltage (in the vicinity of 50 V in this example) of the clamping circuit 102, the clamping circuit 102 causes a breakdown. Accordingly, the gate voltage of the power MOS transistor 101 rapidly increases. As a result, the power MOS transistor 101 turns on and the MOS transistor 201 instantaneously turns on, so that a large current flows through the ESD protection circuit 10a. In other words, a large current generated during the normal operation is absorbed by the ESD protection circuit 10a. At this time, since the MOS transistor 201 instantaneously turns on, no fluctuation occurs in the clamping voltage due to a snap-back operation.

The operation of the ESD protection circuit 10 when the EMI noise is applied to the external input terminal IN during the normal operation will now be described. In this case also, the MOS transistor 201 maintains a high impedance, so no current flows through the ESD protection circuit 10a. In other words, no current unintentionally flows through the ESD protection circuit 10a due to the EMI noise.

In this manner, the ESD protection circuit 10a according to the second embodiment can provide the same advantageous effects as those of the ESD protection circuit 10 according to the first embodiment or more advantageous effects than those of the ESD protection circuit 10.

The ESD protection circuit 10a may be directly provided with a bipolar transistor having the same conductivity type and connection relation as those of the parasitic bipolar transistor 202, instead of being provided with the MOS transistor 201.

Figure 10:
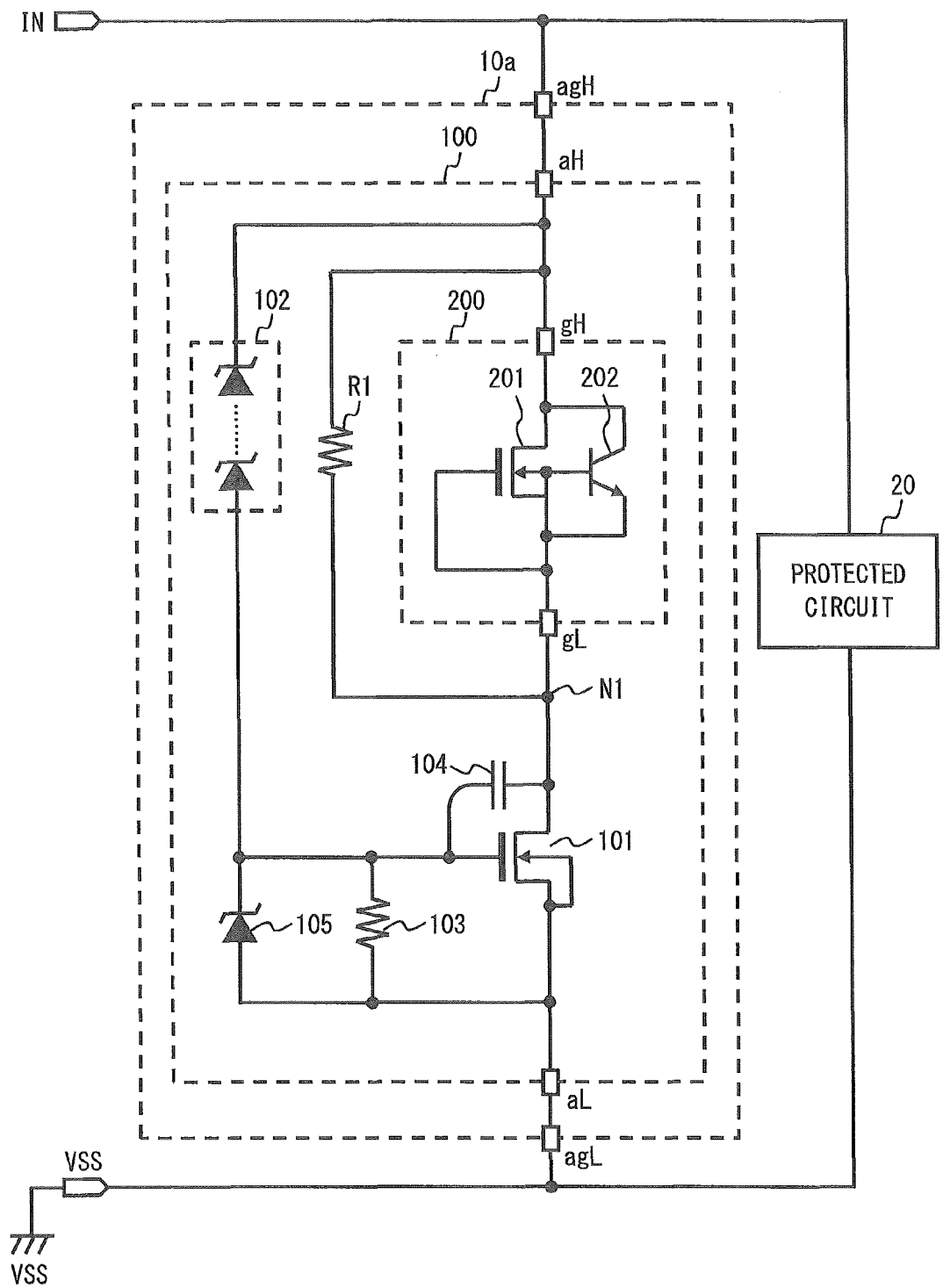
FIG. 10 is a diagram showing a modified example of the ESD protection circuit according to the second embodiment.

As shown in FIG. 10, the ESD protection circuit 10a may further include the resistive element (second resistive element) R1 that is connected in parallel with the protection block 200. This makes it possible to stabilize the initial bias of the node N1.

(Difference Between the Voltage of the ESD Protection Circuit 10 and that of the ESD Protection Circuit 10a During the ESD Protection Operation)

Referring first to FIGS. 2A and 2B, operating characteristics of a single protection block 100 during the ESD protection operation will be described. Assuming that the value of the voltage Va of the high-voltage terminal aH during the ESD protection operation is represented by Vds1, the clamping voltage of the clamping circuit 102 is represented by Vc, and the voltage between the gate and the source of the power MOS transistor 101 is represented by Vgs, the relationship of Vds1=Vc+Vgs is maintained during the ESD protection operation. At this time, assuming that the current flowing through the protection block 100 is represented by Ids1, the amount of voltage change (Rds1) with respect to a current change during the ESD protection operation is determined mainly by the characteristics of Vgs and Ids1.

Referring next to FIGS. 3A and 3B, operating characteristics of a single protection block 200 during the ESD protection operation will be described. Assuming that the value of the voltage Vg of the high-voltage terminal gH during the ESD protection operation is represented by Vds2, a hold voltage is represented by Vh, and a current is represented by Ids2, Vds2=Vh+Rds2×Ids2 holds during the ESD protection operation. At this time, the amount of voltage change (Rds2) with respect to a current change during the ESD protection operation is determined by a parasitic resistance formed between the base and the emitter of the parasitic bipolar transistor 202.

Referring now to FIGS. 1 and 4, operating characteristics of the ESD protection circuit 10 during the ESD protection operation will be described. In the ESD protection circuit 10, assuming that the value of the voltage Vag of the external input terminal IN during the ESD protection operation is represented by Vag1, the following expression (1) holds.

$$Vag1 = Vds1 + Vds2 \quad (1)$$

$$= Vc + Vgs + Vh + Rds2 \times Ids2$$

On the other hand, in the ESD protection circuit 10a shown in FIG. 6, assuming that the value of the voltage Vag of the external input terminal IN during the ESD protection operation is represented by Vag2, the relationship of Vag2=Vc+Vgs is maintained during clamping, as in the case of a single protection block 100. At this time, assuming that the current flowing through the ESD protection circuit 10a is represented by the Iag2, the amount of voltage change with respect to a current change during the ESD protection operation is determined mainly by the characteristics of Vgs and Iag2. In other words, the current dependency of the ESD protection voltage Vag2 of the ESD protection circuit 10a is smaller than the current dependency of the ESD protection voltage Vag1 of the ESD protection circuit 10. Accordingly, the ESD protection voltage Vag2 can be adjusted more easily than in the case of the ESD protection voltage Vag1.

Third Embodiment

Figure 11:
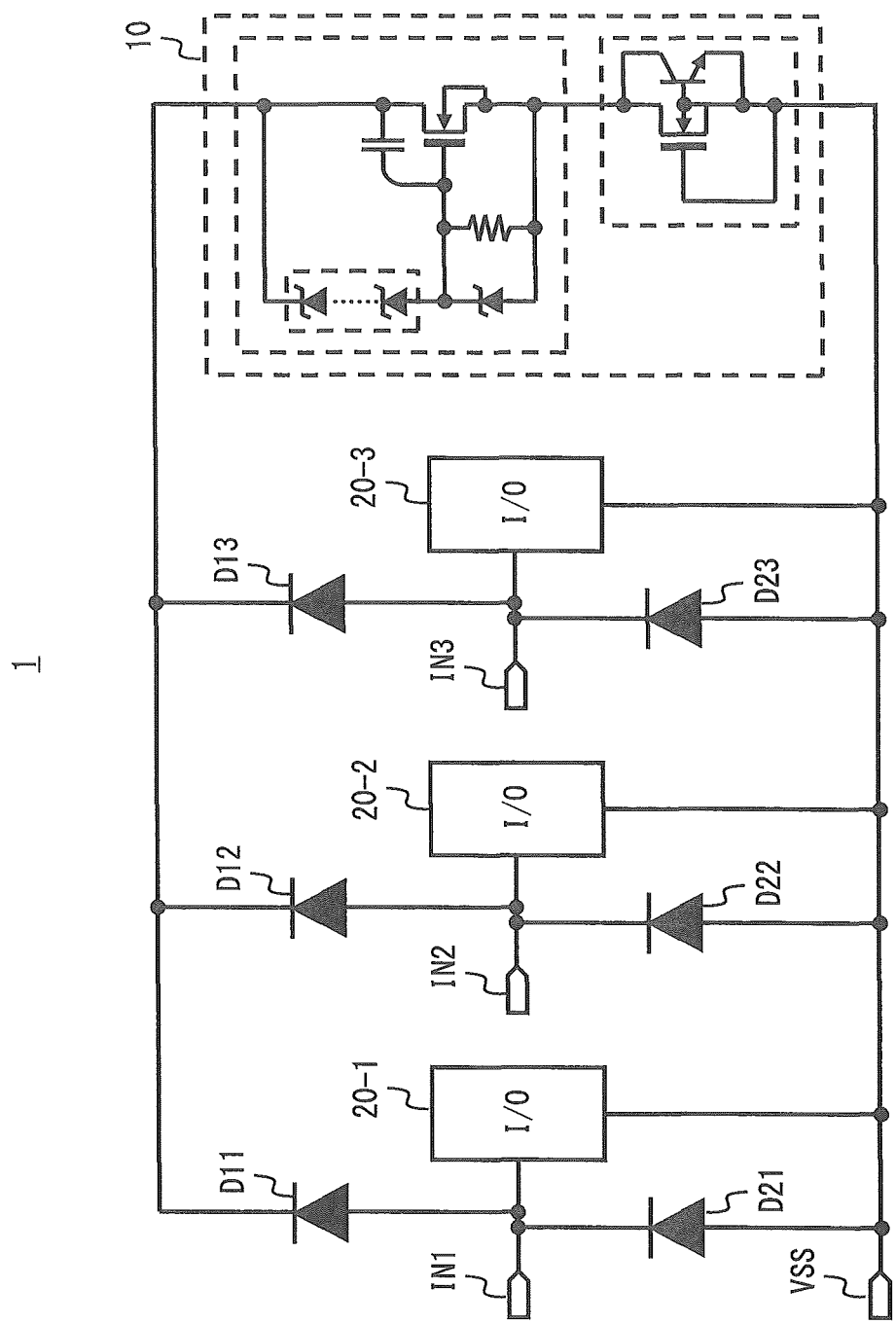
FIG. 11 is a diagram showing a configuration example of an ESD protection system according to a third embodiment.

FIG. 11 is a diagram showing a configuration example of an ESD protection system 1 according to a third embodiment. The ESD protection system 1 shown in FIG. 11 includes the ESD protection circuit 10 that is provided in common to a plurality of protected circuits. This will be described in detail below.

The ESD protection system 1 shown in FIG. 11 includes the ESD protection circuit 10, diodes (first diodes) D11 to D13, and diodes (second diodes) D21 to D23. FIG. 11 also shows a plurality of I/O blocks 20-1 to 20-3 as protected circuits. In this case, the ESD protection circuit 10 and the diodes D11 to D13 are used for positive ESD protection. The diodes D21 to D23 are used for negative ESD protection.

The I/O blocks 20-1 to 20-3 are respectively provided between external input terminals IN1 to IN3 and the reference voltage terminal VSS. The ESD protection circuit 10 is provided in parallel with the I/O blocks 20-1 to 20-3 between the external input terminals IN1 to IN3 and the reference voltage terminal VSS.

The diodes D11 to D13 are respectively provided between the external input terminals IN1 to IN3 and the ESD protection circuit 10. More specifically, the diodes D11 to D13 have anodes respectively connected to the external input terminals IN1 to IN3, and have cathodes each connected to the drain of the power MOS transistor 101 and the clamping circuit 102 which are provided in the ESD protection circuit 10.

The diodes D21 to D23 are respectively provided between the external input terminals IN1 to IN3 and the reference voltage terminal VSS. More specifically, the diodes D21 to D23 have anodes each connected to the reference voltage terminal VSS, and have cathodes respectively connected to the external input terminals IN1 to IN3.

The value of the clamping voltage of the clamping circuit 102 is set in consideration of the amount of voltage drop in the forward direction of the diodes D11 to D13, as well as the trigger voltage of the MOS transistor 201.

With the configuration described above, the ESD protection system 1 shown in FIG. 11 can protect the plurality of I/O blocks 20-1 to 20-3 against the ESD by using one ESD protection circuit 10.

In this case, the economic efficiency in the case where the ESD protection circuit is installed for each protected circuit, and the economic efficiency in the case where one ESD protection circuit is installed for a plurality of protected circuits as in the third embodiment will now be studied. In the ESD protection operation state, the voltage between both ends of each of the diodes D11 to D13 has a value substantially equal to a voltage drop VH in the forward direction of each diode (about VF=0.7 V in the case of silicon diodes). In addition, the time period in which the current flows is short. Accordingly, there is no need to use very large diodes. On the other hand, the voltage between both ends of the ESD protection circuit 10 is several tens of times higher (50 V or more in this example) than the voltage between both ends of the diodes D11 to D13. Therefore, in order to prevent the ESD protection circuit 10 from breaking down due to the ESD protection operation, it is necessary to sufficiently increase the size of the power MOS transistor and the MOS transistor. Accordingly, the ESD protection system 1 shown in FIG. 11 can suppress an increase in circuit size more than in the case where a plurality of ESD protection circuits are respectively provided to the plurality of I/O blocks 20-1 to 20-3.

Figure 12:
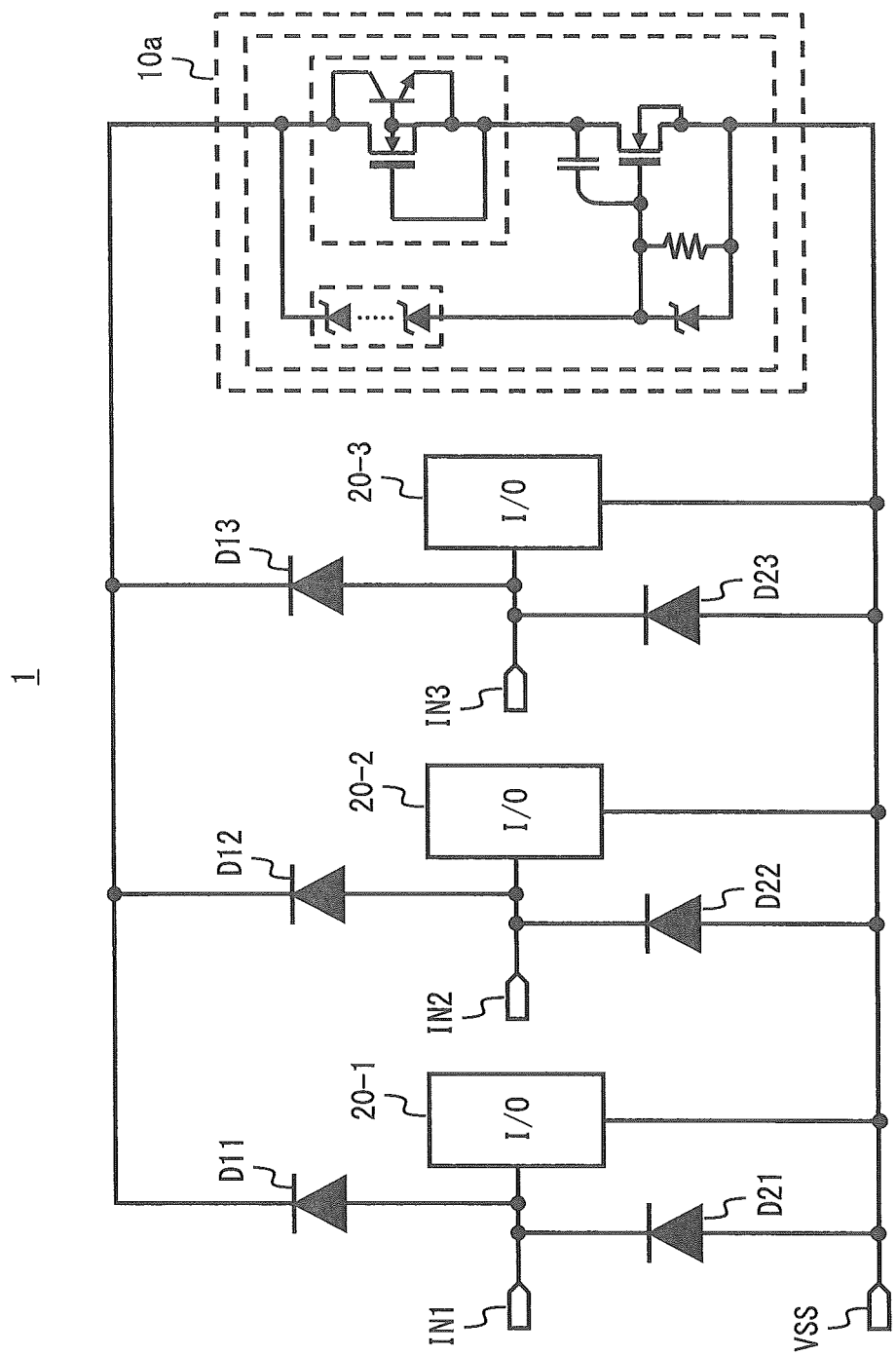
FIG. 12 is a diagram showing a modified example of the ESD protection system according to the third embodiment.

Although the third embodiment illustrates the case where the ESD protection system 1 includes the ESD protection circuit 10, the configuration of the ESD protection system 1 is not limited to this. As shown in FIG. 12, the ESD protection system 1 may include the ESD protection circuit 10a, instead of the ESD protection circuit 10. In this case, the cathodes of the diodes D11 to D13 are each connected to the drain of the MOS transistor 201 (the collector of the parasitic bipolar transistor 202) which is provided in the ESD protection circuit 10a. The ESD protection circuit (10, 10a) provided in the ESD protection system 1 may further include the resistive element R1 that is connected in parallel with the protection block 200.

Fourth Embodiment

Figure 13:
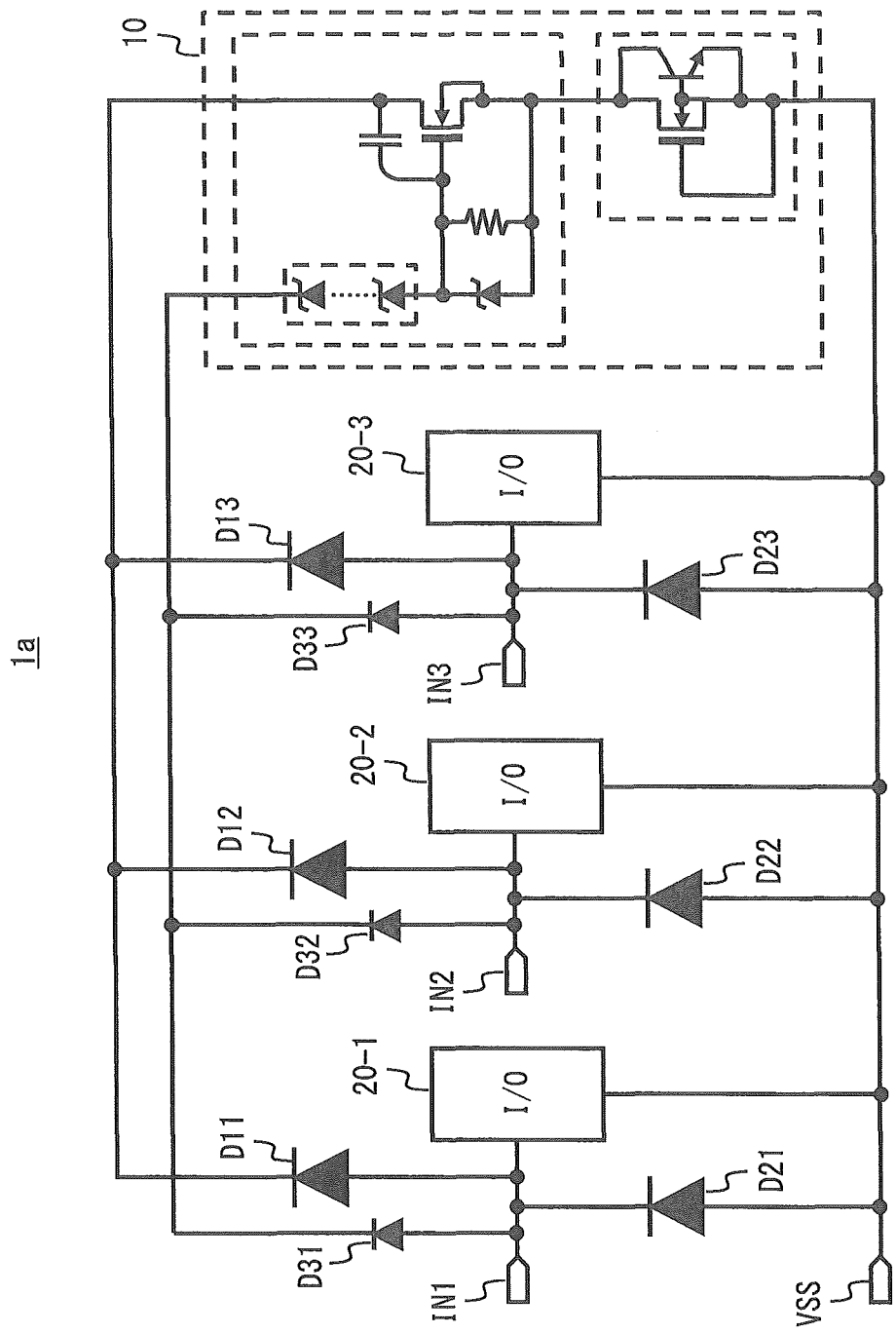
FIG. 13 is a diagram showing a configuration example of an ESD protection system according to a fourth embodiment.

FIG. 13 is a diagram showing a configuration example of an ESD protection system 1a according to a fourth embodiment. As compared with the ESD protection system 1, the ESD protection system 1a shown in FIG. 13 further includes diodes (third diodes) D31 to D33.

The diodes D31 to D33 are respectively provided between the external input terminals IN1 to IN3 and the clamping circuit 102 provided in the ESD protection circuit 10. More specifically, the diodes D31 to D33 have anodes respectively connected to the external input terminals IN1 to IN3, and have cathodes each connected to the clamping circuit 102 provided in the ESD protection circuit 10.

The anodes of the diodes D11 to D13 are respectively connected to the external input terminals IN1 to IN3, and the cathodes of the diodes D11 to D13 are each connected to only the drain of the power MOS transistor 101 provided in the ESD protection circuit 10.

The other components of the ESD protection system 1a shown in FIG. 13 are similar to those of the ESD protection system 1 shown in FIG. 11, so the description thereof is omitted.

The ESD protection system 1a shown in FIG. 13 separates a path (a path on the side of the diodes D11 to D13), through which a large ESD current flows, from a sense line of the clamping circuit 102 (a path on the side of the diodes D31 to D33). This allows the ESD protection system 1a shown in FIG. 13 to achieve a highly precise ESD protection operation by the ESD protection circuit 10, without the influence of voltage drops of the diodes D11 to D13, through which a large current flows, and without the influence of the wiring resistance thereof.

The current flowing through the diodes D31 to D33 is greatly smaller than the current flowing through the diodes D11 to D13. Therefore, the element size of each of the diodes D31 to D33 is extremely small.

Figure 14:
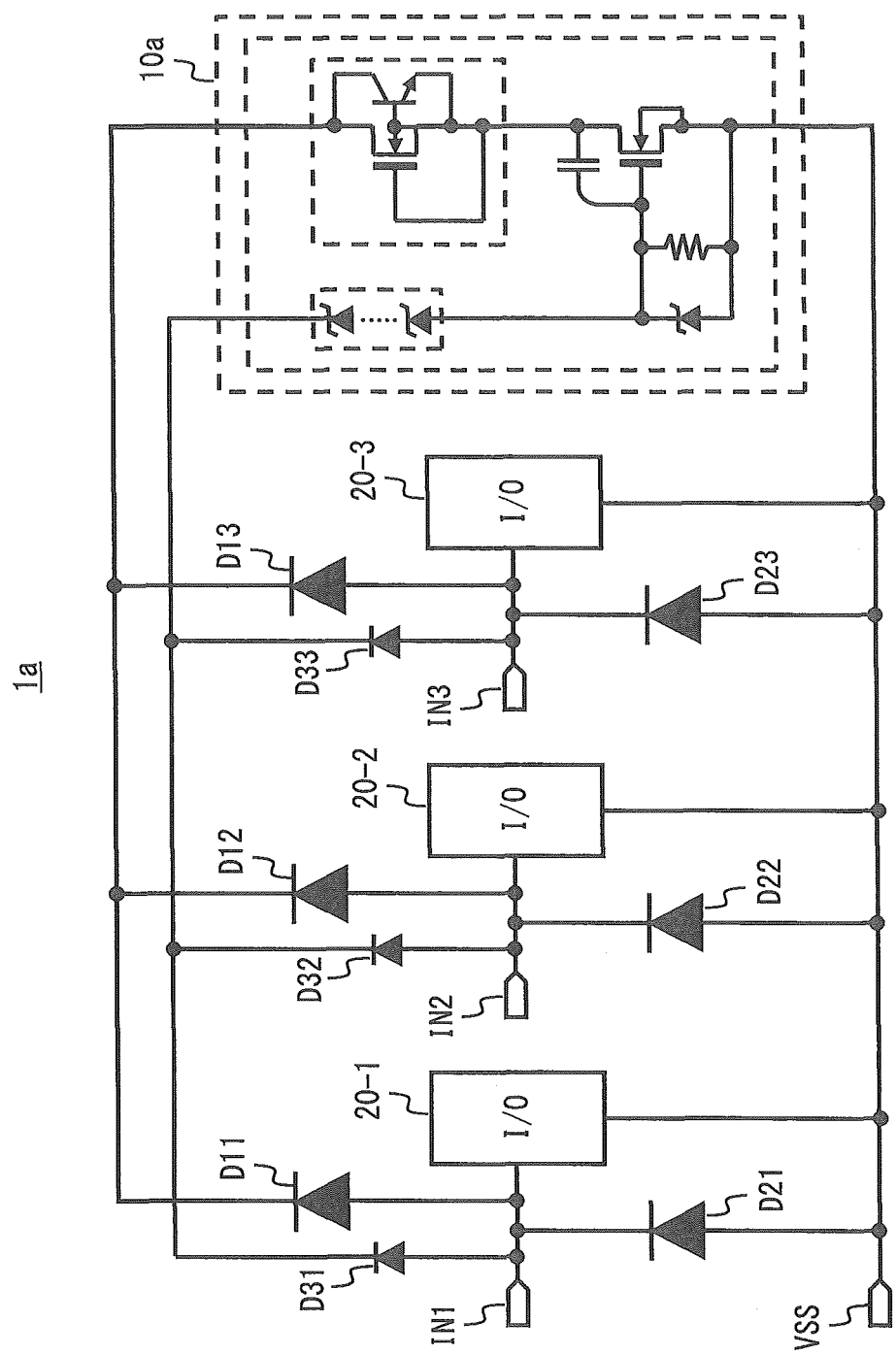
FIG. 14 is a diagram showing a modified example of the ESD protection system according to the fourth embodiment.

Although the fourth embodiment illustrates the case where the ESD protection system 1a includes the ESD protection circuit 10, the configuration of the ESD protection system 1a is not limited to this. As shown in FIG. 14, the ESD protection system 1a may include the ESD protection circuit 10a, instead of the ESD protection circuit 10. In this case, the cathodes of the diodes D11 to D13 are each connected to the drain of the MOS transistor 201 (the collector of the parasitic bipolar transistor 202) which is provided in the ESD protection circuit 10a. The ESD protection circuit (10, 10a) provided in the ESD protection system 1a may further include the resistive element R1 that is connected in parallel with the protection block 200.

In this manner, the ESD protection circuits according to the first to fourth embodiments described above use a combination of the protection blocks 100 and 200, thereby achieving a highly precise ESD protection operation on the high-breakdown-voltage protected circuit, while suppressing occurrence of a malfunction due to the influence of the EMI noise.

Note that the ESD protection circuits according to the first to fourth embodiments described above are applied to, for example, a part of a semiconductor device within an ECU (Engine Control Unit) module mounted in an automobile. The semiconductor device within the ECU module is a device that controls an air bag unit with several channels, a sensor unit with several channels, and the like. The semiconductor device is connected to the air bag unit, the sensor unit, and the like through a harness line. Thus, such a semiconductor device is liable to be affected by the EMI noise transmitted through the harness line. Accordingly, by applying the ESD protection circuits according to the above-described embodiments to a part of such a semiconductor device, the device can be protected against being affected by a transmitted EMI noise.

Fifth Embodiment

A fifth embodiment illustrates an example in which the ESD protection circuits 10 and 10a and ESD protection systems 1 and 1a are applied.

Figure 15:
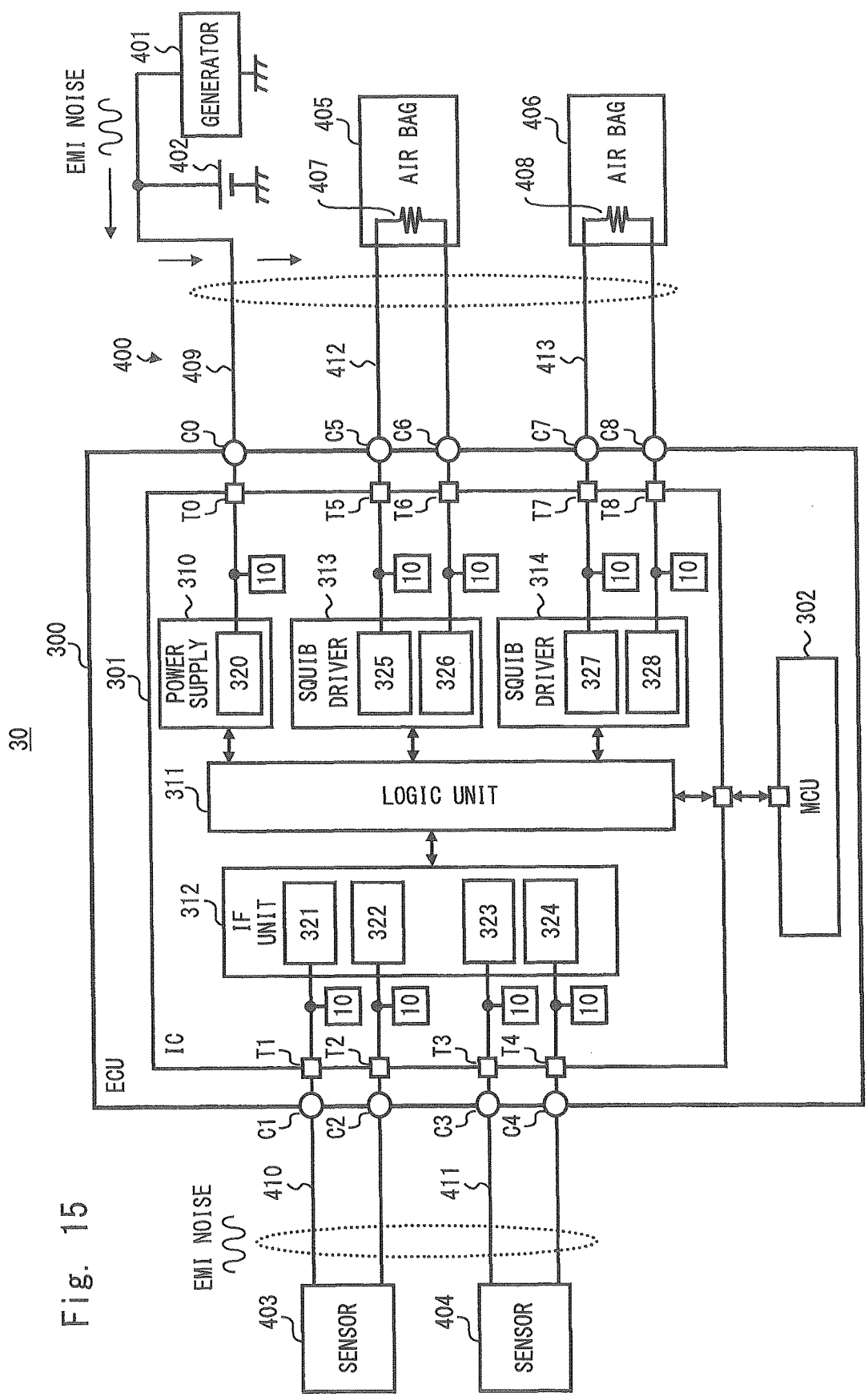
FIG. 15 is a block diagram showing an electronic system according to a fifth embodiment.

FIG. 15 is a block diagram showing an on-vehicle electronic system 30 to which the ESD protection circuit 10 is applied. Here, an air bag system is illustrated by way of example. The ESD protection circuit 10a, or the ESD protection system 1 or 1a, may also be applied, as a matter of course, instead of the ESD protection circuit 10.

As shown in FIG. 15, the on-vehicle electronic system 30 includes an ECU module (on-vehicle electronic device) 300, a generator 401, a battery 402, collision sensor units (controlled devices) 403 and 404, air bag units (controlled devices) 405 and 406, and a harness 400. The ECU module 300, the generator 401, and the battery 402 are connected to each other through the harness 400. The ECU module 300 and the controlled devices (for example, external devices controlled by the ECU module 300, such as the collision sensor units 403 and 404 and air bag units 405 and 406) are connected to each other through the harness 400. The harness 400 includes a bundle of electric wires 409 to 413.

An example in which the collision sensor unit 403 and the air bag unit 405 are used for a driver seat and the collision sensor unit 404 and the air bag unit 406 are used for a front passenger seat will now be described.

The ECU module 300 is, for example, an electronic control unit, and includes a semiconductor chip (semiconductor device) 301, an MCU (arithmetic processing unit) 302, and connectors C0 to C8, which are formed on a semiconductor substrate.

The semiconductor chip 301 includes a power supply 310, a logic unit 311, an IF unit 312, squib drivers 313 and 314, a plurality of ESD protection circuits 10 respectively corresponding to I/O blocks 320 to 328, and a plurality of external connection terminals T0 to T8. The I/O block 320 is provided in the power supply 310; the I/O blocks 321 to 324 are provided in the IF unit 312; the I/O blocks 325 and 326 are provided in the squib driver 313; and the I/O blocks 327 and 328 are provided in the squib driver 314. The logic unit 311 and peripheral circuits thereof (the IF unit 312 and squib drivers 313 and 314) are also referred to simply as a control unit.

The battery 402 is charged by the generator 401, and supplies power to the power supply 310 through the harness 400 (specifically, the electric wire 409), the connector C0, and the external connection terminal T0 The power supply 310 receives power, which is externally supplied, at the I/O block 320 of an input stage, and transforms the power to drive the semiconductor device 301. A line between the I/O block 320 and the external connection terminal T0 is provided with the protection circuit 10.

The collision sensor unit 403 is a unit that detects an collision of a vehicle. The collision sensor unit 403 transmits a detection result to the IF unit 312 through the harness 400 (specifically, the electric wire 410), the connectors C1 and C2, and the external connection terminals T1 and T2. The IF unit 312 receives the detection result (a communication signal; first information) from the collision sensor unit 403 at the I/O blocks 321 and 322 of the input stage, converts the received detection result into a logic signal, and delivers the logic signal to the logic unit 311. A line between the I/O block 321 and the external connection terminal T1 and a line between the I/O block 322 and the external connection terminal T2 are each provided with the protection circuit 10.

Similarly, the collision sensor unit 404 is a unit that detects an collision of the vehicle. The collision sensor unit 404 transmits the detection result to the IF unit 312 through the harness 400 (specifically, the electric wire 411), the connectors C3 and C4, and the external connection terminals T3 and T4. The IF unit 312 receives the detection result (a communication signal; first information) from the collision sensor unit 404 at the I/O blocks 323 and 324 of the input stage, converts the received detection result into a logic signal, and delivers the logic signal to the logic unit 311. A line between the I/O block 323 and the external connection terminal T3 and a line between the I/O block 324 and the external connection terminal T4 are each provided with the protection circuit 10.

The logic unit 311 outputs a control signal (second information) to the air bag units 405 and 406 based on the detection results of the collision sensor units 403 and 404. Specifically, when the collision sensor units 403 and 404 detect an collision of the vehicle, the logic unit 311 outputs a control signal for inflating (developing) air bags of the air bag units 405 and 406. In this case, the logic unit 311 outputs, for example, the detection results of the collision sensor units 403 and 404, or an intermediate signal thereof, to the MCU 302. Upon receiving the signal from the logic unit 311, the MCU 302 executes arithmetic processing and transmits a processing result to the logic unit 311.

Upon receiving the control signal from the logic unit 311, the squib driver 313 causes a current to flow (outputs a signal) to a squib 407 of the air bag unit 405 through the external connection terminals T5 and T6, the connectors C5 and C6, and the harness 400 (specifically, the electric wire 412). As a result, the squib 407 serving as a triggering device operates, and the air bag of the air bag unit 405 expands. The squib driver 313 further includes a failure diagnosis function for diagnosing a ground fault and a power supply fault of the external connection terminals T5 and T6. When it is diagnosed that a failure has occurred, the squib driver 313 sends failure information to the MCU 302, and the MCU 302 performs arithmetic processing in which a control signal to be developed in the semiconductor device 301 is not transmitted even when an collision of the vehicle is detected. This prevents the air bag of the air bag unit 405 from expanding. The squib driver 313 includes the I/O blocks 325 and 326 that serve as a mediator to supply a current to the squib 407. A line between the I/O block 325 and the external connection terminal T5 and a line between the I/O block 326 and the external connection terminal T6 are each provided with the protection circuit 10.

Upon receiving the control signal from the logic unit 311, the squib driver 314 causes a current to flow to a squib 408 of the air bag unit 406 through the external connection terminals T7 and T8, the connectors C7 and C8, and the harness 400 (specifically, the electric wire 413). As a result, the squib 408 serving as a triggering device operates, and the air bag of the air bag unit 406 expands. The squib driver 314 further includes a failure diagnosis function for diagnosing a ground fault and a power supply fault of the external connection terminals T7 and T8. When it is diagnosed that a failure has occurred, the squib driver 314 sends failure information to the MCU 302, and the MCU 302 performs arithmetic processing in which a control signal to be developed in the semiconductor device 301 is not transmitted even when an collision of the vehicle is detected. This prevents the air bag of the air bag unit 406 from expanding. The squib driver 314 includes the I/O blocks 327 and 328 that serve as a mediator to supply a current to the squib 408. A line between the I/O block 327 and the external connection terminal T7 and a line between the I/O block 328 and the external connection terminal T8 are each provided with the protection circuit 10.

In the on-vehicle electronic system 30, EMI noise is generated mainly in the generator 401. The EMI noise generated in the generator 401 is supplied to the external connection terminal T0 through the electric wire 409, transmitted to other electric wires 410 to 413 constituting the harness 400 together with the electric wire 409, and supplied to the external connection terminals T1 to T8. That is, the EMI noise can be supplied to any of the external connection terminals T0 to T8 which are connected to the harness 400. Accordingly, the external connection terminals T0 to T8 of the semiconductor device 301 require a resistance to the EMI noise. Especially, with the development in motorization of vehicles, EMI noise generated in another electronic system is transmitted through a harness running in parallel. Therefore, there is an increasing need for each external connection terminal of the semiconductor device to have a resistance to EMI noise. In other words, the ESD protection circuit 10 provided to each external connection terminal of the semiconductor device needs to achieve a highly precise ESD protection operation without causing any malfunction due to the influence of the EMI noise.

If the external connection terminals T1 to T4 are respectively provided with ESD protection circuits having a low resistance to the EMI noise, a malfunction occurs in these ESD protection circuits due to the influence of the EMI noise received from the harness 400. Accordingly, operating currents of the ESD protection circuits are added to the communication signals from the collision sensor units 403 and 404, which may result in difficulty in correctly transmitting the communication signals.

If the external connection terminals T5 to T8 are respectively provided with ESD protection circuits having a low resistance to the EMI noise, a malfunction occurs in these ESD protection circuits due to the influence of the EMI noise received from the harness 400. The influence of operating currents of these ESD protection circuits may inhibit the squib drives 313 and 314 from normally performing a failure diagnosis. This may result in difficulty in expanding the air bags of the air bag units 405 and 407 upon a collision of the vehicle.

Thus, in the on-vehicle electronic system 30, the external connection terminals T0 to T8 are respectively provided with the ESD protection circuits 10 each having a high resistance to the EMI noise. This allows the on-vehicle electronic system 30 to achieve a highly precise ESD protection operation without causing any malfunction due to the influence of the EMI noise, thereby making it possible to control opening and closing of the air bags with a high precision.

Although the fifth embodiment illustrates the example in which the on-vehicle electronic system 30 is an air bag system, the configuration of the vehicle electronic system 30 is not limited to this. The on-vehicle electronic system 30 may be another electronic system that executes a break control, an engine control, or the like when the vehicle approaches an obstacle.

Note that in recent years, a reduction in threshold voltage of power MOS transistors makes it difficult to achieve the ESD protection operation while ensuring the resistance to EMI noise. To avoid such a problem, it is generally considered that in each power MOS transistor used for ESD protection, the resistance to ESD noise is ensured by reducing the gate voltage sensitivity by increasing the source length, or is ensured by making a response to the gate voltage slower by reducing the impedance between the gate and the source, and the resistance to ESD noise is ensured by increasing the size of the power MOS transistor. However, this leads to an increase in circuit size. On the other hand, it is not necessary for the ESD protection circuits according to the embodiments described above to increase the size of the power MOS transistor, so that an increase in circuit size can be suppressed.

While the embodiments of the invention made by the present inventor have been described in detail above, the present invention is not limited to the embodiments described above. The present invention can be modified in various manners without departing from the gist of the invention.

For example, in the semiconductor device according to the embodiment described above, the conductivity type (p-type or n-type) of the semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An ESD (Electro-Static Discharge) protection circuit comprising:
   a power MOS (Metal-Oxide-Semiconductor) transistor provided between an external connection terminal and a reference voltage terminal;
   a clamping circuit that is provided between the external connection terminal and a gate of the power MOS transistor and clamps a voltage between the external connection terminal and the gate of the power MOS transistor at a predetermined value or less;
   a first resistive element provided between the gate and a source of the power MOS transistor; and
   a MOS transistor that is provided in series with the power MOS transistor and has a gate and a source which are commonly connected to each other,
   wherein the MOS transistor is provided between the external connection terminal and a drain of the power MOS transistor.

2. The ESD protection circuit according to claim 1, wherein a parasitic bipolar transistor is formed, the parasitic bipolar transistor having a collector, a base, and an emitter respectively corresponding to a drain, a backgate, and a source of the MOS transistor.

3. The ESD protection circuit according to claim 1, further comprising a second resistive element provided between the source and a drain of the MOS transistor.

4. A semiconductor device comprising:
   a first external connection terminal that receives first information from a first controlled device;
   a second external connection terminal that outputs second information to a second controlled device;
   a control unit that generates the second information based on the first information; and
   ESD protection circuits according to claim 1, respectively provided to at least the first external connection terminal and the second external connection terminal.

5. The semiconductor device according to claim 4, wherein
   the control unit includes a logic unit and a peripheral circuit,
   the logic unit executes arithmetic processing on an input logic signal and outputs the second information, and
   the peripheral circuit converts the first information into the logic signal and delivers the logic signal to the logic unit, and outputs the second information received from the logic unit to an outside through the second external connection terminal.

6. The semiconductor device according to claim 5, wherein
   the peripheral circuit includes an IF unit and a squib driver, the IF unit receives the first information at an I/O block of an input stage, converts the received first information into the logic signal, and delivers the logic signal to the logic unit, and the squib driver outputs the second information received from the logic unit to an outside through the second external connection terminal.

7. The semiconductor device according to claim 4, wherein a parasitic bipolar transistor is formed, the parasitic bipolar transistor having a collector, a base, and an emitter respectively corresponding to a drain, a backgate, and a source of the MOS transistor.

8. An on-vehicle electronic device comprising:
a semiconductor device; and
an arithmetic processing unit that receives a signal from the semiconductor device, executes arithmetic processing on the signal, and transmits a processing result to the semiconductor device, the semiconductor device and the arithmetic processing unit being formed on a substrate, wherein
the semiconductor device includes:
a first external connection terminal that receives first information from a first controlled device;
a second external connection terminal that outputs second information to a second controlled device;
a control unit that generates the second information based on the first information; and
ESD protection circuits according to claim 1, respectively provided to at least the first external connection terminal and the second external connection terminal.

9. The on-vehicle electronic device according to claim 8, wherein a parasitic bipolar transistor is formed, the parasitic bipolar transistor having a collector, a base, and an emitter respectively corresponding to a drain, a backgate, and a source of the MOS transistor.

10. An on-vehicle electronic system comprising:
a semiconductor device;
a battery that supplies power to the semiconductor device; and
a controlled device that transmits and receives a signal to and from the semiconductor device, wherein
the semiconductor device includes:
a first external connection terminal connected to the battery through a harness;
a second external connection terminal connected to the controlled device through the harness;
a power supply that generates a power supply voltage by transforming the power supplied from the battery to the first external connection terminal;
a control unit that transmits and receives a signal to and from the controlled device through the second external connection terminal; and
an ESD protection circuit according to claim 1, provided to the second external connection terminal.

11. The on-vehicle electronic system according to claim 10, further comprising:
first and second controlled devices each serving as the controlled device; and
first and second ESD protection circuits each serving as the ESD protection circuit, the first and second ESD protection circuits being respectively provided to the first and second controlled devices,
wherein the first controlled device is a collision sensor unit that detects a collision of a vehicle, and wherein the second controlled device is an air bag unit mounted with an air bag, opening and closing of the air bag being controlled based on a detection result of the collision sensor unit.

12. The on-vehicle electronic system according to claim 10, wherein a parasitic bipolar transistor is formed, the parasitic bipolar transistor having a collector, a base, and an emitter respectively corresponding to a drain, a backgate, and a source of the MOS transistor.

13. A semiconductor device comprising:
the ESD protection circuit according to claim 1; and
a protected circuit supplied with a voltage of the external connection terminal.

14. An ESD protection system comprising:
the ESD protection circuit according to claim 1, the ESD protection circuit being provided in common to a plurality of external connection terminals;
a plurality of first diodes having anodes respectively connected to the plurality of external connection terminals, and cathodes each connected to a drain of the power MOS transistor and the clamping circuit; and
a plurality of second diodes having cathodes respectively connected to the plurality of external connection terminals, and anodes each connected to the reference voltage terminal.

15. An ESD protection system comprising:
the ESD protection circuit according to claim 1, the ESD protection circuit being provided in common to a plurality of external connection terminals;
a plurality of first diodes having anodes respectively connected to the plurality of external connection terminals, and cathodes each connected to a drain of the power MOS transistor;
a plurality of second diodes having cathodes respectively connected to the plurality of external connection terminals, and anodes each connected to the reference voltage terminal; and
a plurality of third diodes having anodes respectively connected to the plurality of external connection terminals, and cathodes each connected to the clamping circuit.

16. The semiconductor device according to claim 1, further comprising a parasitic capacitive element being formed between the gate and a drain of the power MOS transistor.

17. An ESD protection system comprising:
a first diode;
a second diode;
a third diode;
a fourth diode; and
an ESD (Electro-Static Discharge) protection circuit, wherein
the ESD protection circuit includes:
a power MOS (Metal-Oxide-Semiconductor) transistor provided between an external connection terminal and a reference voltage terminal;
a clamping circuit that is provided between the external connection terminal and a gate of the power MOS transistor and clamps a voltage between the external connection terminal and the gate of the power MOS transistor at a predetermined value or less;
a first resistive element provided between the gate and a source of the power MOS transistor; and
a MOS transistor that is provided in series with the power MOS transistor and has a gate and a source which are commonly connected to each other, wherein the MOS transistor is provided between the external connection terminal and a drain of the power MOS transistor, wherein the external connection terminal comprises a first external connection terminal and a second external connection terminal, wherein the first external connection terminal is connected to an anode of the first diode and a cathode of the third diode, wherein the second external connection terminal is connected to an anode of the second diode and a cathode of the fourth diode, wherein a drain of the MOS transistor and the clamping circuit are connected to a cathode of the first diode and a cathode of the second diode, and wherein the reference voltage terminal is connected to an anode of the third diode and an anode of the fourth diode.

18. An ESD protection system comprising:
a first diode;
a second diode;
a third diode;
a fourth diode;
a fifth diode;
a sixth diode; and
an ESD (Electro-Static Discharge) protection circuit, wherein
the ESD protection circuit includes:
  a power MOS (Metal-Oxide-Semiconductor) transistor provided between an external connection terminal and a reference voltage terminal;
  a clamping circuit that is provided between the external connection terminal and a gate of the power MOS transistor and clamps a voltage between the external connection terminal and the gate of the power MOS transistor at a predetermined value or less;
  a first resistive element provided between the gate and a source of the power MOS transistor; and
  a MOS transistor that is provided in series with the power MOS transistor and has a gate and a source which are commonly connected to each other, wherein the MOS transistor is provided between the external connection terminal and a drain of the power MOS transistor, wherein the external connection terminal comprises a first external connection terminal and a second external connection terminal, wherein the first external connection terminal is connected to an anode of the first diode, a cathode of the third diode and an anode of the fifth diode, wherein the second external connection terminal is connected to an anode of the second diode, a cathode of the fourth diode and an anode of the sixth diode, wherein a drain of the MOS transistor is connected to a cathode of the first diode and a cathode of the second diode, wherein the reference voltage terminal is connected to an anode of the third diode and an anode of the fourth diode, and wherein the clamping circuit is connected to a cathode of the fifth diode and a cathode of the sixth diode.

19. The ESD protection system according to claim 18, wherein an element size of each of the fifth diode and the sixth diode is smaller than that of each of the first diode and the second diode.

* * * * *